(12) United States Patent
Vyers et al.

(10) Patent No.: US 10,606,288 B2
(45) Date of Patent: Mar. 31, 2020

(54) PRESSURE CONTROL METHOD FOR PROCESS CHAMBER AND PRESSURE CONTROL DEVICE FOR PROCESS CHAMBER

(71) Applicant: INOVITA PTE LTD, Singapore (SG)

(72) Inventors: Emmanuel Vyers, Singapore (SG); Mie Kimura, Singapore (SG)

(73) Assignee: INOVITA PTE LTD, Singapore (SG)

( * ) Notice: Subject to any disclaimer, the term of this patent is extended or adjusted under 35 U.S.C. 154(b) by 31 days.

(21) Appl. No.: 16/141,523

(22) Filed: Sep. 25, 2018

(65) Prior Publication Data

US 2019/0094892 A1  Mar. 28, 2019

(30) Foreign Application Priority Data

Sep. 27, 2017 (JP) .................................. 2017-186319

(51) Int. Cl.
*G05D 16/20* (2006.01)
*G05B 19/418* (2006.01)

(52) U.S. Cl.
CPC ... *G05D 16/2073* (2013.01); *G05B 19/41885* (2013.01); *G05D 16/202* (2013.01);
(Continued)

(58) Field of Classification Search
CPC .... G05B 19/41885; G05B 2219/35261; G05B 2219/45031; G05D 16/202; G05D 16/2046; G05D 16/2073
See application file for complete search history.

(56) References Cited

U.S. PATENT DOCUMENTS

| 9,880,569 B2 | 1/2018 | Vyers et al. |
| 2007/0193628 A1* | 8/2007 | Kannan ................ G05D 7/0652 |
| | | 137/487.5 |
| 2017/0152869 A1* | 6/2017 | Sakai .................... F04B 43/073 |

FOREIGN PATENT DOCUMENTS

| JP | H03-171306 | 7/1991 |
| JP | 5087073 | 2/2007 |

(Continued)

*Primary Examiner* — Chad G Erdman
(74) *Attorney, Agent, or Firm* — Pearne & Gordon LLP

(57) ABSTRACT

A gas pressure within a treatment chamber 2 can be more accurately regulated to a predicted target pressure whereby there can be provided a pressure control apparatus which can easily and speedily regulate the gas pressure for various combination of the treatment chamber 2, a sanction chamber 3 and a valve 4. A required inflow rate (Qi) at which it is necessary for gas to flow into the treatment chamber 2 in order to reach a preset target pressure (Psp) within the treatment chamber is calculated on the basis of the expression of Qi=Qo+(P/□t)V and the thus calculated required inflow rate (Qi) is flown into the treatment chamber 2 to control the pressure within the treatment chamber 2 to the required pressure (Psp). In calculation of a current predicted outflow rate (Qo(n)) at which gas is discharged from the treatment chamber on the basis of the expression Qo(n) =P2*f1(P2), using a current pressure (P2) within the suction pump and a known characteristic suction rate (Sp=f1(P2)) of the suction pump under prescribed pressure, the current pressure (P2) within the suction pump is calculated according to the expression P2=P1−(Qo(n−1)/f2(θ, P)) from an accurate conductance (Cv(θ, P)=f2(θ, P)) calculated by adding the error between the current pressure (P1) actually measured within the treatment chamber and a known specified pressure (P) within the treatment chamber at the characteristic conductance (Cv=f2(θ)) of the valve at the opening/closing angle (θ) associated with the current position of (Continued)

the switching plate of the valve to the known characteristic conductance (Cv=f2($\theta$)) of the valve at the opening/closing angle ($\theta$) associated with the current position of the switching plate of the valve, and the current predicted outflow rate $Qo(n)$ at which gas is discharged from the treatment chamber is calculated.

18 Claims, 12 Drawing Sheets

(52) U.S. Cl.
CPC ............... *G05D 16/2046* (2013.01); *G05B 2219/35261* (2013.01); *G05B 2219/45031* (2013.01)

(56) References Cited

FOREIGN PATENT DOCUMENTS

| | | | |
|---|---|---|---|
| JP | 2009-530737 | 8/2009 | |
| JP | 5854335 | 12/2015 | |
| KR | 100528229 B1 * | 11/2005 | ............. G05D 16/20 |

* cited by examiner

FIG. 4
CHARACTERISTIC CONDUCTANCE OF VALVE AT OPENING/CLOSING ANGLE ($\theta$) ASSOCIATED WITH CURRENT POSITION OF THE GATE OF THE VALVE
$$C_v = f_2(\theta)$$
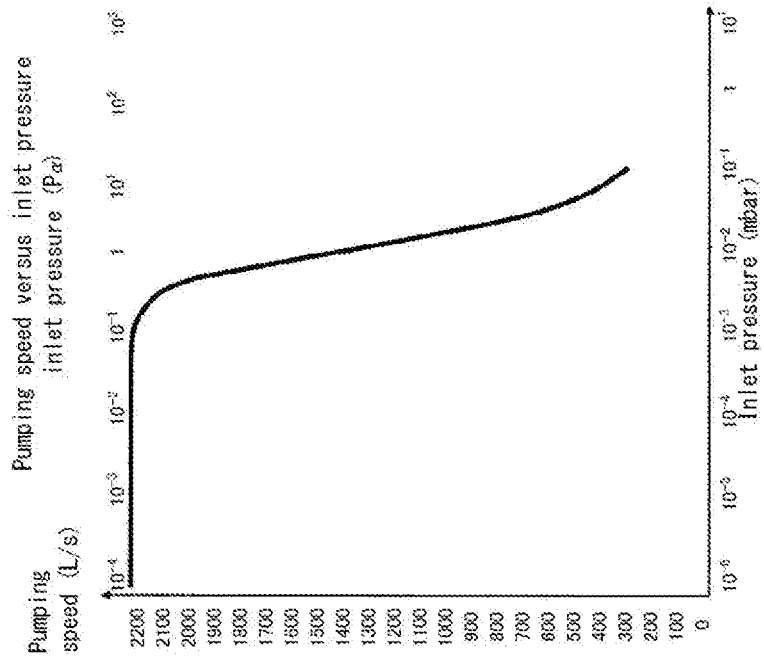
CHARACTERISTIC PUMPING RATE OF VACUUM PUMP UNDER PRESET PRESSURE
$$S_p = f_1(P_2)$$
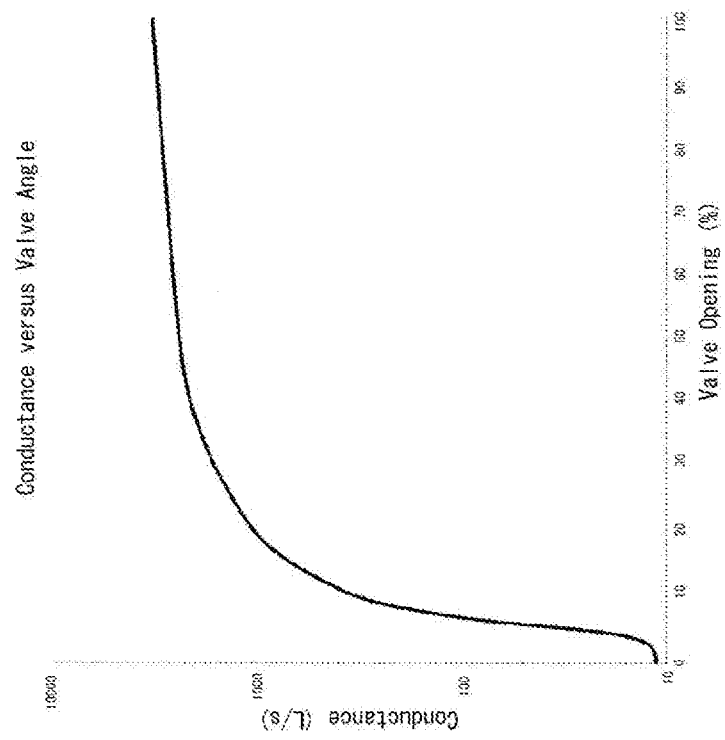

FIG.6
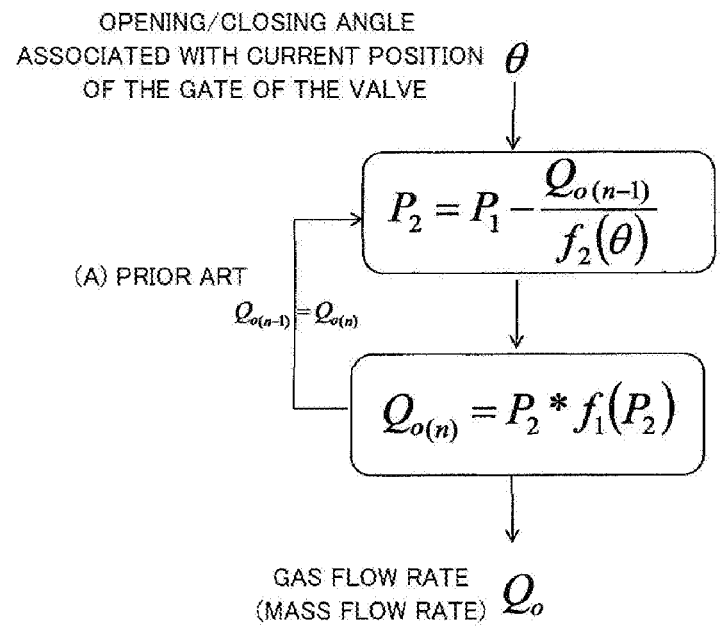
(A) PRIOR ART
GAS FLOW RATE
(MASS FLOW RATE) $Q_o$
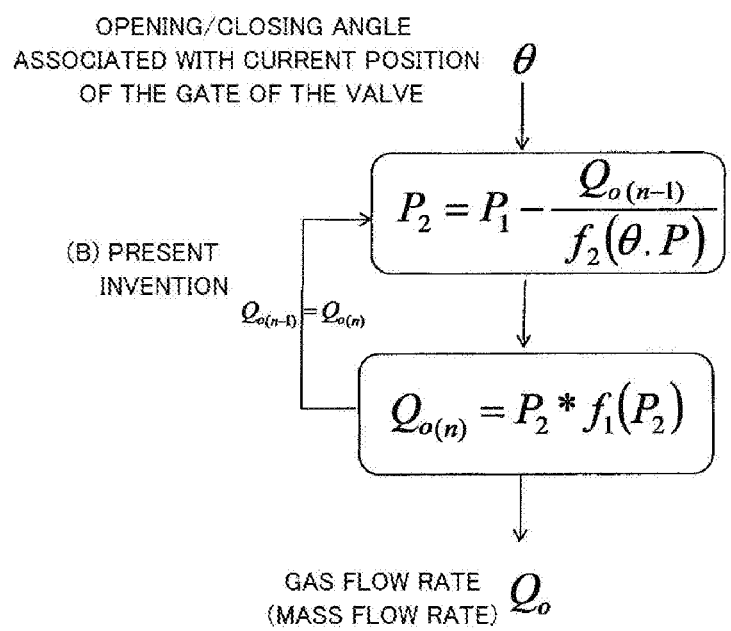
(B) PRESENT INVENTION
GAS FLOW RATE
(MASS FLOW RATE) $Q_o$

FIG. 10

PRIOR ART: CALCULATION ONLY BY SINGLE GAS FLOW (Q₁)

$$C_V(\theta) = \frac{Q_1}{P(\theta) - \frac{Q_1}{S_p}} \rightarrow C_v = \frac{Q}{P_1 - P_2}$$

PRESENT INVENTION: CALCULATION BY TWO GAS FLOWS (Q₁, Q₂)

$$C_{VQ_1}(\theta) = \frac{Q_1}{P_{Q_1}(\theta) - \frac{Q_1}{S_p}}$$

$$C_{VQ_2}(\theta) = \frac{Q_2}{P_{Q_2}(\theta) - \frac{Q_2}{S_p}}$$

$$C_C(\theta) = \frac{C_{VQ_1}(\theta) - C_{VQ_2}(\theta)}{P_{Q_1}(\theta) - P_{Q_2}(\theta)}$$

$$C_V(\theta, P) = C_{VQ_1}(\theta) + \left[C_C(\theta) \times (P_1 - P_{Q_1}(\theta))\right]$$

PRESSURE CONTROL METHOD FOR PROCESS CHAMBER AND PRESSURE CONTROL DEVICE FOR PROCESS CHAMBER

TECHNICAL FIELD OF THE INVENTION

The present invention relates to improvements to a method for controlling pressure in a process chamber and to a device for controlling pressure in a process chamber, intended for use, for example, in process chambers of various types for semiconductor devices, in order to regulate the pressure within the process chamber to a preset target value (pressure setpoint).

PRIOR ART OF THE INVENTION

In production operations for semiconductor devices, it is common practice to control the pressure of various source gas and the like introduced into etching devices or into process chambers of various types, for carrying out processes such as thin film processes involving chemical vapor deposition (CVD), PVD, or other processes, so that the pressure is brought to a preset target value (pressure setpoint), preventing scatter of particles or the like due to pressure overshoot.

It has been proposed, when controlling pressure within a process chamber, to install a variable conductance valve between the process chamber and the vacuum pump, and to regulate the opening position (aperture) of the variable conductance valve in order to regulate the pressure within the process chamber to a preset value (for example, see Japanese Unexamined Patent Application Publication (Translation of PCT Application) 2009-530737, Japanese Patent Publication 5087073, and Japanese Unexamined Patent Application Publication H3(1981)-171306).

In more specific terms, it has been proposed to provide the system with a pressure sensor configured to measure the pressure of the fluid in the chamber, a valve configured to regulate the flow of the fluid from the process chamber by moving between an open position and a closed position, and a controller configured to generate a pump speed curve of the valve, wherein the pump speed curve represents the pump speed C (L (liters)/sec) of the system, which is controlled by the valve and which is a function of the valve position; the controller is configured to monitor and modify the pump speed curve so as to maintain the slope of the pump speed curve at least a minimum value; the controller is further configured to employ the modified pump speed curve in order to regulate the valve position in response to pressure measurements by the pressure sensor, so as to maintain pressure within the process chamber at the desired pressure setpoint; and the controller is further configured to estimate a volume of the process chamber, and to generate the pump speed curve using the estimated volume together with pressure measurements made by the pressure sensor at a plurality of positions of the valve (see Japanese Patent Publication 5,087,073 and U.S. Pat. No. 9,880,569).

That is, according to this prior art technique, through a process of learning pump speed at each aperture of the valve, it is attempted to maintain pressure at a preset value by maintaining the slope of the pump speed curve at least a minimum value, i.e., through approximation of a constant value. However, this prior art technique requires ongoing monitoring and modification of the pump speed curve, therefore making it necessary to operate the system once with dummy wafers to make the system learn each combination of process chamber type and vacuum pump or valve, prior to running the system; as well as to reset the curve each time that these combinations change. The system therefore lacks practicality, and has the problem that considerable time and labor are required for making settings before the system can be run.

Moreover, this prior art technique involves deriving the pump speed curve from the estimated volume of the process chamber and the measured pressure of the fluid within the process chamber. In actual practice, in many instances, the volume of the process chamber is known, whereas on the other hand, in the case of gas such a source gas, the pump speed of the vacuum pump is known to be affected by the pressure of fluid within the vacuum pump, as shown in FIG. 4 and FIG. 12. Consequently, while it would be preferable to take into account this pressure of gas within the vacuum pump, by estimating the gas outflow rate and calculating the inflow rate needed to maintain the pressure at a preset constant value, this pressure of gas within the vacuum pump is not taken into account in any of the prior art techniques, and there is the additional problem that pressure of gas inside a vacuum pump is not always easy to measure.

Moreover, the characteristic pumping rate (L/s) observed when this vacuum pump is at preset pressure, and the characteristic conductance (L/s) of the valve observed with the gate of the valve at a given aperture, differ by each vacuum pump and valve maker, and by product (size), and therefore the process of calculating the necessary inflow rate on the basis of pressure of gas within the vacuum pump in order to control pressure within the process chamber requires the operator to input characteristic values for each product, for each combination of valve and vacuum pump, posing the risk that even simple regulation will be difficult (see Japan Patent Publication 5854335).

The inventors have therefore proposed (see Patent Document 4) appropriately controlling the gas pressure within a treatment chamber to a prescribed target pressure (pressure setpoint) by calculating the current predicted outflow rate ($Qo(n)$) at which gas is discharged from the treatment chamber on the basis of the expression $Qo(n)=P_2 \ast f_1(P_2)$ from the current pressure ($P_2$) within a suction pump and the known characteristic suction rate ($Sp=f_1(P_2)$) under prescribed pressure of the suction pump, and then calculating the required inflow rate (Qi) at which it is necessary for gas to flow into the treatment chamber to reach the target pressure on the basis of the expression $Qi=Qo+(\Delta P/\Delta t)V$, bringing about inflow of the calculated required inflow rate (Qi) into the treatment chamber, and controlling the pressure within the treatment chamber to the target pressure (Psp) (see Japanese Patent Publication 5854335).

In this case, the current pressure ($P_2$) within the suction pump is calculated using the expression $P_2=P_1-(Qo(n-1)/f_2(\theta))$, from a known characteristic conductance ($Cv=f_2(\theta)$) of the valve at the opening/closing angle ($\theta$) associated with the current position of a switching plate of the valve, and the current predicted outflow rate $Qo(n)$ at which gas is discharged from the treatment chamber is calculated, whereby it is possible to accurately calculate the required inflow rate (Qi) at which it is necessary for gas to flow into the treatment chamber to reach the target pressure.

At the same time, the calculated current predicted outflow rate $Qo(n)$ of gas is fed back by being re-input in the form of the term $Qo(n-1)$ in the expression $P_2=P_1-(Qo(n-1)/f_2(\theta))$ used to derive the current pressure ($P_2$) within the suction pump, and the required inflow rate (Qi) at which it is necessary for gas to flow into the treatment chamber to reach the target pressure (Psp) is calculated constantly, according to change in the current pressure ($P_2$) within the suction pump, thereby affording the advantage of being able to constantly and instantaneously respond to changes in pressure.

In this invention, however, the current pressure ($P_2$) within the suction pump is calculated on the basis of only a known characteristic conductance ($Cv=f_2(\theta)$) of the valve at the opening/closing angle ($\theta$) associated with the current position of the switching plate of the valve, i.e., the conductance (a pre-set fixed specified value) for a single gas flow at the current time, but the conductance (Cv) of the valve is represented by the expression $Cv=Q/(P_1-P_2)$, by the relationship between the flow rate (Q) and the pressure difference ($P_1-P_2$) between the pressure ($P_1$) within the treatment chamber and the pressure ($P_2$) within the suction pump, and is therefore actually affected by the pressure within the suction pump and the treatment chamber, which is constantly changing even during minute time periods, and the pressure difference thereof (and consequently by changes in the pressure within the treatment chamber) particularly in the practical zone of transitional flow, as shown in FIG. 7. Consequently, by calculating the current pressure ($P_2$) within the suction pump, having derived a more accurate conductance by also taking into account the change in pressure, and consequently pressure difference, within the abovementioned minute time period, it is possible to more appropriately calculate the current predicted outflow rate (Qo(n)) and consequently the required inflow rate (Qi).

With the foregoing in view, an object of the present invention is to provide a method for controlling pressure in a process chamber, whereby pressure of gas inside a process chamber can be more accurately regulated to a preset target value, and which can easily and rapidly be adapted to various combinations of process chambers, vacuum pumps, and valves; and a device for controlling pressure in a process chamber, which can be used in the method.

SUMMARY OF THE INVENTION (1. Pressure Control Method)

The present invention according to a first aspect for solving the afore-described problem provides a pressure control method for regulating the pressure of gas inside a treatment chamber in a semiconductor production step via a valve situated between the treatment chamber and a suction pump for suctioning gas from within the treatment chamber, wherein the method for controlling pressure in a treatment chamber is characterized in that a predicted outflow rate (Qo) at which gas is discharged from the treatment chamber via the suction pump by the suction of the suction pump is computed, and when a required inflow rate (Qi) at which it is necessary for gas to flow into the treatment chamber in order to reach a preset target pressure (Psp) within the treatment chamber is calculated on the basis of the expression $Qi=Qo+(P/\Delta t)V$ from a known volume (V) of the treatment chamber, and a pressure change rate ($\Delta P/\Delta t$) required for the current pressure ($P_1$) within the treatment chamber to reach the target pressure (Psp) is calculated, the rate being derived from the difference between the current pressure ($P_1$) within the treatment chamber and the target pressure (Psp), and inflow of the calculated required inflow rate (Qi) into the treatment chamber is brought about and the pressure within the treatment chamber is controlled to the target pressure (Psp), in calculation of a current predicted outflow rate (Qo(n)) at which gas is discharged from the treatment chamber on the basis of the expression $Qo(n)=P_2*f_1(P_2)$, using a current pressure ($P_2$) within the suction pump and a known characteristic suction rate ($Sp=f_1(P_2)$) of the suction pump under prescribed pressure, the current pressure ($P_2$) within the suction pump is calculated according to the expression $P_2=P_1-(Qo(n-1)/f_2(\theta, P))$ from an accurate conductance ($Cv(\theta, P)=f_2(\theta, P)$) calculated by adding the error between the current pressure ($P_1$) actually measured within the treatment chamber and a known specified pressure (P) within the treatment chamber at the characteristic conductance ($Cv=f_2(\theta)$) of the valve at the opening/closing angle ($\theta$) associated with the current position of the switching plate of the valve to the known characteristic conductance ($Cv=f_2(\theta)$) of the valve at the opening/closing angle ($\theta$) associated with the current position of the switching plate of the valve, and the current predicted outflow rate Qo(n) at which gas is discharged from the treatment chamber is calculated.

The present invention according to a second aspect for solving the afore-described problem provides a method for controlling pressure in a treatment chamber according to the first aspect, characterized in that, after a correction value ($Cc(\theta)$) is established and stored in advance for each of the opening/closing angles ($\theta$) of the switching plate of the valve, the correction value ($Cc(\theta)$) being specified by taking into account the change in conductance of the valve and the change in pressure within the treatment chamber, the accurate conductance ($Cv(\theta, P)=f_2(\theta, P)$) is calculated according to the expression $Cv(\theta, P)=Cv_{Q1}(\theta)+[Cc(\theta)\times(P_1-P_{Q1}(\theta))]$ from the calculated value ($Cv_{Q1}(\theta)$) of the conductance of the valve at the opening/closing angle ($\theta$) associated with the current position of the switching plate of the valve, the calculated value ($P_{Q1}(\theta)$) of the known specified pressure within the treatment chamber at the conductance ($Cv_{Q1}(\theta)$), and the corresponding correction value ($Cc(\theta)$) for the current pressure ($P_1$) actually measured within the treatment chamber and the opening/closing angle ($\theta$) associated with the current position of the switching plate of the valve.

The present invention according to a third aspect for solving the afore-described problem provides a method for controlling pressure in a treatment chamber according to the second aspect, characterized in that the correction value ($Cc(\theta)$) is calculated from the expression $Cc(\theta)=Cv_{Q1}(\theta)-Cv_{Q2}(\theta)/P_{Q1}(\theta)-P_{Q2}(\theta)$ as the general relationship of the ratio of the change in the characteristic conductance ($Cv_{Q1}(\theta), Cv_{Q2}(\theta)$) of the valve and the pressure ($P_{Q1}(\theta), P_{Q2}(\theta)$) within the treatment chamber between two gas flow rates ($Q_1, Q_2$) arbitrarily selected within the range of the practical zone of transitional flow in a graph of the function indicating the relationship between the physically determined characteristic conductance of the valve and the pressure within the treatment chamber, the correction value ($Cc(\theta)$) is calculated and stored in advance for each opening/closing angle ($\theta$) of the switching plate of the valve, the correction value ($Cc(\theta)$) that corresponds to the opening/closing angle ($\theta$) is selected in accordance with the opening/closing angle ($\theta$) associated with the current position of the switching plate of the valve, and the selected correction value is inputted into the expression $Cv(\theta, P)=Cv_{Q1}(\theta)+[Cc(\theta)\times(P_1-P_{Q1}(\theta))]$.

The present invention according to a fourth aspect for solving the afore-described problem provides a method for controlling pressure in a treatment chamber according to the third aspect, characterized in that the characteristic conductances ($Cv_{Q1}(\theta), Cv_{Q2}(\theta)$) of the valve at the two gas flow rates ($Q_1, Q_2$) arbitrarily selected within the transitional flow range, which is the practical zone, are calculated in advance for each opening/closing angle ($\theta$) of the switching plate of the valve according to the expressions $Cv_{Q1}(\theta)=Q_1/[P_{Q1}(\theta)-(Q_1/Sp)]$ and $Cv_{Q2}(\theta)=Q_2/[P_{Q2}(\theta)-(Q_2/Sp)]$, respectively, from the two gas flow rates ($Q_1$, $Q_2$), the pressures ($P_{Q1}(\theta)$, $P_{Q2}(\theta)$) within the treatment chamber measured at the two gas flow rates ($Q_1$, $Q_2$), and the known characteristic suction rate (Sp) of the suction pump, and the correction value ($Cc(\theta)$) is calculated by inputting the calculated conductances ($Cv_{Q1}(\theta)$, $Cv_{Q2}(\theta)$) and the pressures ($P_{Q1}(\theta)$, $P_{Q2}(\theta)$) within the treatment chamber measured at the two gas flow rates ($Q_1$, $Q_2$) into the expression $Cc(\theta)=Cv_{Q1}(\theta)-Cv_{Q2}(\theta)/P_{Q1}(\theta)-P_{Q2}(\theta)$.

The present invention according to a fifth aspect for solving the afore-described problem provides a method for controlling pressure in a treatment chamber according to the third or fourth aspect, characterized in that the gas flow rate values of 100 sccm and 200 sccm are used as the two gas flow rates ($Q_1$, $Q_2$) arbitrarily selected within the transitional flow range, which is the practical zone.

The present invention according to a sixth aspect for solving the afore-described problem provides a method for controlling pressure in a process chamber according to any of the first through fifth aspects, characterized in that the calculated current predicted outflow rate Qo(n) of gas is fed back by being re-inputted in the form of the term Qo(n−1) in the expression $P_2=P_1-(Qo(n-1)/f_2(\theta, P))$ used to derive the current pressure ($P_2$) within the vacuum pump; the $P_2$ thusly calculated is then substituted for the terms $P_2$ and $f_1(P_2)$ in the expression $Qo(n)=P_2*f_1(P_2)$ used to derive the predicted current outflow rate of gas discharged from the process chamber, whereby the current predicted outflow rate Qo(n) of gas is calculated; and the input flow rate (Qi) at which it is necessary for gas to flow into the process chamber to reach the target pressure (Psp) is calculated constantly, according to change in the current pressure ($P_2$) within the vacuum pump.

The present invention according to a seventh aspect for solving the afore-described problem provides a method for controlling pressure in a process chamber according to any of the first to sixth aspects, characterized in that the gate is displaced to a position equivalent to a preset opening/closing angle ($\theta$), to obtain a specific conductance (Cv) necessary for the valve to ensure the input flow rate (Qi), and the pressure within the process chamber is controlled to the target pressure (Psp).

The present invention according to an eighth aspect for solving the afore-described problem provides a method for controlling pressure in a process chamber according to any of the first to seventh aspects, characterized in that a characteristic conductance ($Cv=f_2(\theta)$) of the valve at the opening/closing angle ($\theta$) associated with the current position of the gate of the valve is stored in advance, for each class of the valves; a characteristic pumping rate ($Sp=f_1(P_2)$) of the vacuum pump at preset pressure is stored in advance, for each class of the vacuum pumps; and the current predicted outflow rate Qo(n) at which gas is discharged from the process chamber is calculated.

The present invention according to a ninth aspect for solving the afore-described problem provides a method for controlling pressure in a process chamber according to the eighth aspect, characterized in that the inputted characteristic pumping rate ($Sp=f_1(P_2)$) of the vacuum pump is switched in accordance with the class of the vacuum pump, and the inputted characteristic conductance ($Cv=f_2(\theta)$) of the valve at the opening/closing angle ($\theta$) associated with the current position of the gate of the valve is switched in accordance with the class of the valve.

(2. Pressure Control Device)

The present invention also provides the pressure control device described below, which can be used in the method for controlling pressure in a treatment chamber according to any of the first through ninth aspects. That is, the present invention according to a tenth aspect for solving the afore-described problem provides a device for controlling pressure in a treatment chamber, for regulating the pressure of gas inside a treatment chamber in a semiconductor production step, via a valve situated between the treatment chamber and a suction pump for suctioning gas from within the treatment chamber, the device for controlling pressure in a treatment chamber characterized by comprising: outflow rate computing means for computing a predicted outflow rate (Qo) at which gas is discharged from the treatment chamber via the suction pump by the suction of the suction pump; required inflow rate computing means for calculating, on the basis of the expression $Qi=Qo+(P/\Delta t)V$, a required inflow rate (Qi) at which it is necessary for gas to flow into the treatment chamber in order to reach a preset target pressure (Psp) within the treatment chamber, from a known volume (V) of the treatment chamber and a pressure change rate ($\Delta P/\Delta t$) required for the current pressure ($P_1$) within the treatment chamber to reach the target pressure (Psp), the rate being derived from the difference between the current pressure ($P_1$) and the target pressure (Psp); and inflow rate regulating means for regulating the inflow rate at which gas is to flow into the treatment chamber, to the required inflow rate (Qi) calculated on the basis of the required inflow rate computing means; and when inflow of the required inflow rate (Qi) into the treatment chamber is brought about by the inflow rate regulating means and the pressure within the treatment chamber is controlled to the target pressure (Psp), in calculation by the outflow rate computing means of a current predicted outflow rate (Qo(n)) at which gas is discharged from the treatment chamber on the basis of the expression $Qo(n)=P_2*f_1(P_2)$, using a current pressure ($P_2$) within the suction pump and a known characteristic suction rate ($Sp=f_1(P_2)$) of the suction pump under prescribed pressure, the current pressure ($P_2$) within the suction pump is calculated according to the expression $P_2=P_1-(Qo(n-1)/f_2(\theta, P))$ from an accurate conductance ($Cv(\theta, P)=f_2(\theta, P)$) calculated by adding the error between the current pressure ($P_1$) actually measured within the treatment chamber and a known specified pressure (P) within the treatment chamber at the characteristic conductance ($Cv=f_2(\theta)$) of the valve at the opening/closing angle ($\theta$) associated with the current position of the switching plate of the valve to the known characteristic conductance ($Cv=f_2(\theta)$) of the valve at the opening/closing angle ($\theta$) associated with the current position of the switching plate of the valve, and the current predicted outflow rate Qo(n) at which gas is discharged from the treatment chamber is calculated.

The present invention according to an eleventh aspect for solving the afore-described problem provides a device for controlling pressure in a treatment chamber according to the tenth aspect, characterized in that, after establishing and storing a correction value ($Cc(\theta)$) in advance for each of the opening/closing angles ($\theta$) of the switching plate of the valve, the correction value ($Cc(\theta)$) being specified by taking into account the change in conductance of the valve and the change in pressure within the treatment chamber, the outflow rate computing means calculates the accurate conductance ($Cv(\theta, P)=f_2(\theta, P)$) according to the expression $Cv(\theta, P)=Cv_{Q1}i(\ )+[Cc(\theta)\times(P_1-P_{Q1}(\theta))]$ from the calculated value ($Cv_{Q1}(\theta)$) of the conductance of the valve at the opening/closing angle ($\theta$) associated with the current position of the switching plate of the valve, the calculated value ($P_{Q1}(\theta)$) of the known specified pressure within the treatment chamber at the conductance ($Cv_{Q1}(\theta)$), and the corresponding correction value ($Cc(\theta)$) for the current pressure ($P_1$) actually measured within the treatment chamber and the opening/closing angle ($\theta$) associated with the current position of the switching plate of the valve.

The present invention according to a twelfth aspect for solving the afore-described problem provides a device for controlling pressure in a treatment chamber according to the eleventh aspect, characterized in that the outflow rate computing means calculates the correction value ($Cc(\theta)$) from the expression $Cc(\theta)=Cv_{Q1}(\theta)-Cv_{Q2}(\theta)/P_{Q1}(\theta)-P_{Q2}(\theta)$ as the general relationship of the ratio of the change in the characteristic conductance ($Cv_{Q1}(\theta)$, $Cv_{Q2}(\theta)$) of the valve and the pressure ($P_{Q1}(\theta)$, $P_{Q2}(\theta)$) within the treatment chamber between two gas flow rates ($Q_1$, $Q_2$) arbitrarily selected within the transitional flow range, which is the practical zone, in a graph of the function indicating the relationship between the physically determined characteristic conductance of the valve and the pressure within the treatment chamber, calculates and stores in advance the correction value ($Cc(\theta)$) for each opening/closing angle ($\theta$) of the switching plate of the valve, selects the correction value ($Cc(\theta)$) that corresponds to the opening/closing angle ($\theta$) in accordance with the opening/closing angle ($\theta$) associated with the current position of the switching plate of the valve, and inputs the selected correction value into the expression $Cv(\theta, P)=Cv_{Q1}i(\ )+[Cc(\theta)\times(P_1-P_{Q1}(\theta))]$.

The present invention according to a thirteenth aspect for solving the afore-described problem provides a device for controlling pressure in a treatment chamber according to the twelfth aspect, characterized in that the outflow rate computing means calculates in advance, for each opening/closing angle ($\theta$) of the switching plate of the valve, the characteristic conductances ($Cv_{Q1}(\theta)$, $Cv_{Q2}(\theta)$) of the valve at the two gas flow rates ($Q_1$, $Q_2$) arbitrarily selected within the transitional flow range, which is the practical zone, according to the expressions $Cv_{Q1}(\theta)=Q_1/[P_{Q1}(\theta)-(Q_1/Sp)]$ and $Cv_{Q2}(\theta)=Q_2/[P_{Q2}(\theta)-(Q_2/Sp)]$, respectively, from the two gas flow rates ($Q_1$, $Q_2$), the pressures ($P_{Q1}(\theta)$, $P_{Q2}(\theta)$) within the treatment chamber measured at the two gas flow rates ($Q_1$, $Q_2$), and the known characteristic suction rate ($Sp$) of the suction pump, and calculates the correction value ($Cc(\theta)$) by inputting the calculated conductances ($Cv_{Q1}(\theta)$, $Cv_{Q2}(\theta)$) and the pressures ($P_{Q1}(\theta)$, $P_{Q2}(\theta)$) within the treatment chamber measured at the two gas flow rates ($Q_1$, $Q_2$) into the expression $Cc(\theta)=Cv_{Q1}(\theta)-Cv_{Q2}(\theta)/P_{Q1}(\theta)-P_{Q2}(\theta)$.

The present invention according to a fourteenth aspect for solving the afore-described problem provides a device for controlling pressure in a treatment chamber according to the twelfth or thirteenth aspect, characterized in that the outflow rate computing means uses the gas flow rate values of 100 sccm and 200 sccm as the two gas flow rates ($Q_1$, $Q_2$) arbitrarily selected within the transitional flow range, which is the practical zone.

The present invention according to a fifteenth aspect for solving the afore-described problem provides a device for controlling pressure in a process chamber according to any of the ten through fourteenth aspects, characterized in that the outflow rate computing means feeds back the calculated current predicted outflow rate $Qo(n)$ of gas through re-inputting thereof in the form of the term $Qo(n-1)$ in the expression $P_2=P_1(Qo(n-1)/f_2(\theta, P))$; and then substitutes the thusly calculated $P_2$ for the terms $P_2$ and $f_1(P_2)$ in the expression $Qo(n)=P_2*f_1(P_2)$, in order to calculate the current predicted outflow rate $Qo(n)$ of gas; and the input flow rate computing means constantly calculates the input flow rate ($Qi$) at which it is necessary for gas to flow into the process chamber to reach the target pressure ($Psp$), according to change in the current pressure ($P_2$) within the vacuum pump, doing so on the basis of the current predicted outflow rate $Qo(n)$ calculated by the outflow rate computing means.

The present invention according to a sixteen aspect for solving the afore-described problem provides a device for controlling pressure in a process chamber according to any of the tenth through fifteenth aspects, characterized in that the inflow rate regulating means displaces the gate to a position equivalent to a preset opening/closing angle ($\theta$), to obtain a specific conductance ($Cv$) necessary for the valve to ensure the input flow rate ($Qi$), and controls the pressure within the process chamber to the target pressure ($Psp$).

The present invention according to a seventeenth aspect for solving the afore-described problem provides a device for controlling pressure in a process chamber according to any of the tenth to sixteenth aspects, characterized in that the outflow rate computing means stores in advance, for each class of the valves, a characteristic conductance ($Cv=f_2(\theta)$) of the valve at the opening/closing angle ($\theta$) associated with the current position of the valve gate; stores in advance, for each class of the vacuum pumps, a characteristic pumping rate ($Sp=f_1(P_2)$) of the vacuum pump at preset pressure; and calculates the current predicted outflow rate $Qo(n)$ at which gas is discharged from the process chamber.

The present invention according to a eighteenth aspect for solving the afore-described problem provides a device for controlling pressure in a process chamber according to the seventeeth aspect, characterized by having setting means that can switch the inputted vacuum pump characteristic pumping rate ($Sp=f_1(P_2)$), in accordance with the class of the vacuum pump, and switch the inputted characteristic conductance ($Cv=f_2(\theta)$) of the valve at the opening/closing angle ($\theta$) associated with the current position of the gate of the valve, in accordance with the class of the vacuum pump.

Effect of the Invention

According to the present invention, upon calculation of the current predicted outflow rate ($Qo(n)$) at which gas is discharged from the process chamber, doing so on the basis of the expression $Qo(n)=P_2*f_1(P_2)$, from the current pressure ($P_2$) within the vacuum pump and the known characteristic pumping rate ($Sp=f_1(P_2)$) of the vacuum pump under preset pressure, the input flow rate ($Qi$) at which it is necessary for gas to flow into the process chamber in order to reach the target pressure is calculated on the basis of the expression $Qi=Qo+(P/\Delta t)V$, and inflow of the calculated input flow rate ($Qi$) into the process chamber is brought about, controlling the pressure within the process chamber to the target pressure ($Psp$), thereby affording the advantage that the pressure of the gas within the process chamber can be accurately controlled to a preset target value (pressure setpoint).

In this case, through the present invention, the current pressure ($P_2$) within the suction pump is calculated according to the expression $P_2=P_1-(Qo(n-1)/f_2(\theta, P))$ from the accurate conductance ($Cv(\theta, P)=f_2(\theta, P)$) calculated by adding the error between the current pressure ($P_1$) actually measured within the treatment chamber and a known specified pressure ($P$) within the treatment chamber at the characteristic conductance ($Cv=f_2(\theta)$) of the valve at the opening/closing angle ($\theta$) associated with the current position of the switching plate of the valve to the known characteristic conductance ($Cv=f_2(\theta)$) of the valve at the opening/closing angle ($\theta$) associated with the current position of the switching plate of the valve, as described above, and the current predicted outflow rate (Qo(n)) at which gas is discharged from the treatment chamber is calculated. The practical advantage is therefore gained that it is possible to respond also to changes in the pressure within the treatment chamber and to even more accurately calculate the required inflow rate (Qi) at which it is necessary for gas to flow into the treatment chamber to reach the target pressure. Specifically, although only a specified characteristic (single point of) data that was simply pre-established and learned was taken into account as the conductance of the valve in the prior art, changes in the pressure within the treatment chamber that occur constantly even in minute time periods are taken into account in advance in the present invention by the correction value established by considering the change in pressure and the gas flow conductance at two points, and a more accurate actual conductance is calculated. The practical advantage is therefore gained that the pressure can be more accurately controlled.

At the same time, in the afore-described manner, according to the present invention, the calculated current predicted outflow rate Qo(n) of gas is fed back by being re-input in the form of the term Qo(n−1) in the expression $P_2=P_1$ (Qo(n−1)/$f_2(\theta)$) used to derive the current pressure ($P_2$) within the vacuum pump, and the input flow rate (Qi) at which it is necessary for gas to flow into the process chamber to reach the target pressure (Psp) is calculated constantly, according to change in the current pressure ($P_2$) within the vacuum pump, thereby affording the advantage of being able to constantly and instantaneously respond to changes in pressure.

Further, in the afore-described manner, according to the present invention, the characteristic conductance (Cv=$f_2(\theta)$) of the valve associated with the opening/closing angle ($\theta$) of the valve at the current position of the gate of the valve is stored in advance for each class of the valves, the characteristic pumping rate (Sp=$f_1(P_2)$) of the vacuum pump at preset pressure is stored in advance for each class of the vacuum pumps, and the current predicted outflow rate Qo(n) at which gas is discharged from the process chamber is calculated, thereby affording the advantage of being able to accurately accommodate various combinations of valves and vacuum pumps.

Additionally, in the afore-described manner, according to the present invention, the setting means can switch the inputted characteristic pumping rate (Sp=$f_1(P_2)$) of the vacuum pump in accordance with the class of the vacuum pump, and switch the inputted characteristic conductance (Cv=$f_2(\theta)$) of the valve at the opening/closing angle ($\theta$) associated with the current position of the gate of the valve in accordance with the class of the vacuum pump, thereby affording the advantage of being able to make accurate settings appropriate to various combinations of valves and vacuum pumps, and to do so easily and quickly.

BRIEF DESCRIPTION OF THE DRAWINGS

FIG. 4 is a graph showing function curves in an example of a characteristic pumping rate, under preset pressure, of a vacuum pump employed in the present invention, and of a characteristic conductance of a valve at the opening/closing angle ($\theta$) associated with the current position of the gate of the valve;

FIG. 6 is diagram showing functions employed in the course of feedback of the calculated current predicted outflow rate at which gas is discharged from the treatment chamber, to calculate the current pressure within the suction pump, in the pressure control method, FIG. 6(A) being the prior art function, and FIG. 6(B) being the function of the present invention;

FIG. 10 is a diagram showing the function of the conventional method for deriving the valve conductance and the function of the present invention;

FIG. 11 is a diagram showing the functions in the process for calculating the accurate conductance in the present invention; and.

DESCRIPTION OF THE PREFERRED EMBODIMENTS

Figure 1:
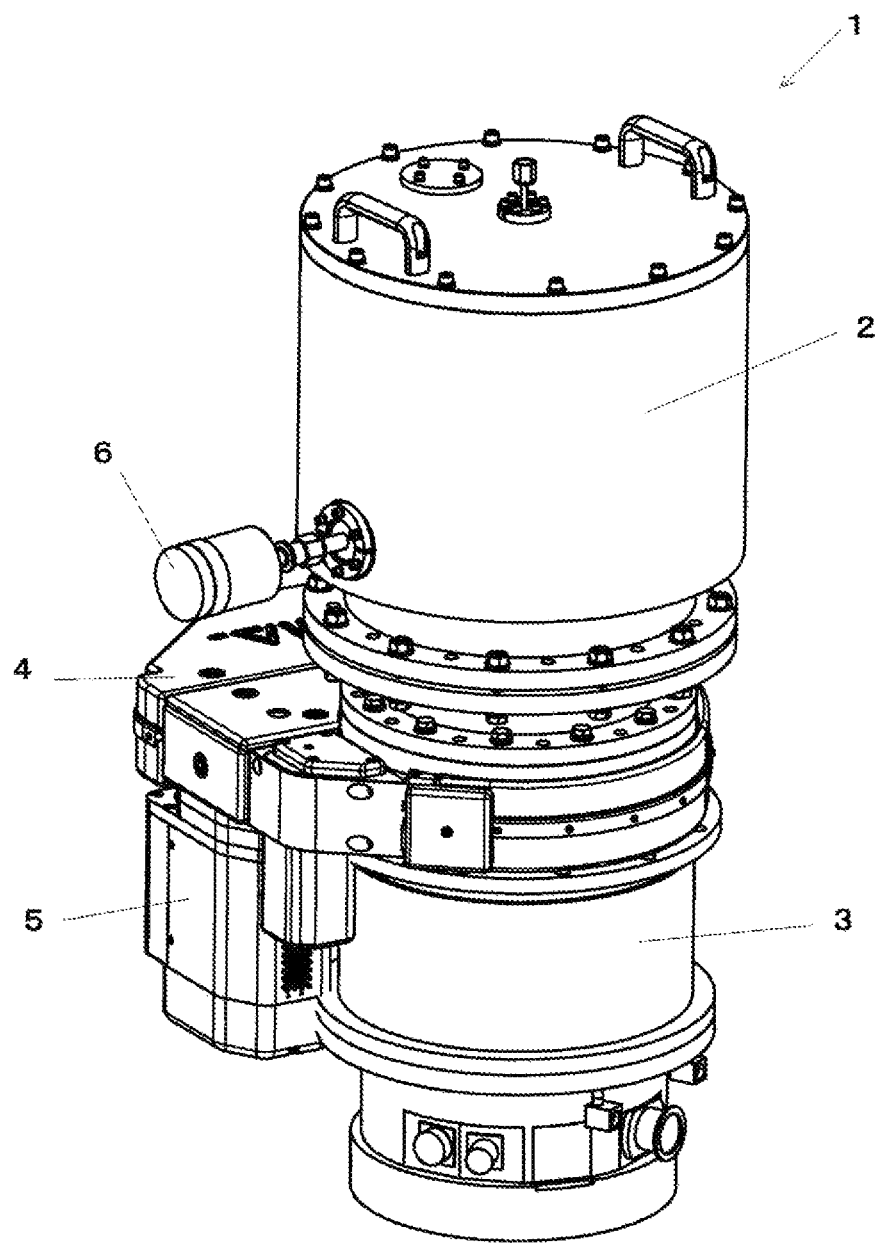
FIG. 1 is a perspective view of a semiconductor production device equipped with the pressure control device of the present invention.
Figure 2:
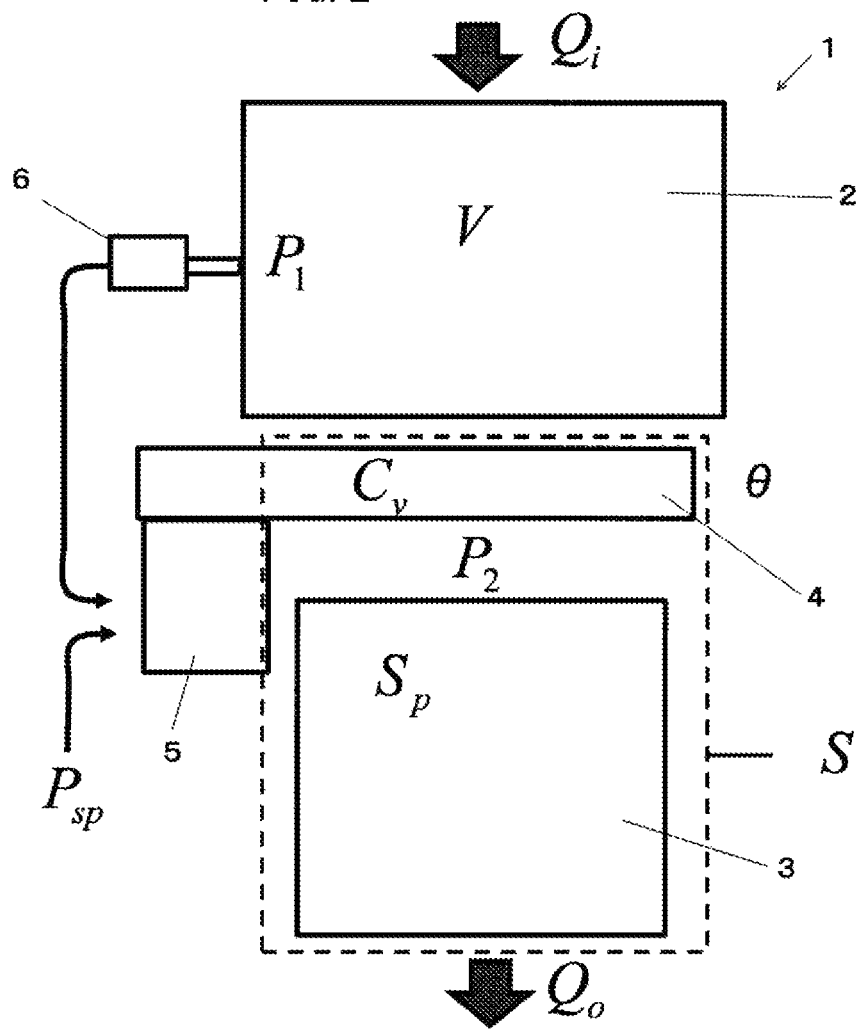
FIG. 2 is a conceptual diagram of a semiconductor production device equipped with the pressure control device of the present invention.

Preferred embodiments for carrying out the present invention will be discussed in detail while making reference to the drawings. FIGS. 1 and 2 show a semiconductor production device 1 equipped with a pressure control device 10 for carrying out the pressure control method of the present invention. This semiconductor production device 1 is provided with a process chamber 2 used in a semiconductor production step, a vacuum pump 3 for suctioning gas within the process chamber 2, a valve 4 situated between the process chamber 2 and the vacuum pump 3, and a controller 5 attached to the valve 4, for controlling the valve 4.

With this semiconductor production device 1, after semiconductor wafers, not illustrated, have been placed within the process chamber 2, source gas is introduced into the process chamber 2, and with the process chamber 2 interior regulated to a preset target pressure (pressure setpoint) through opening or closing of the valve 4, the valve 4 is then closed to seal the process chamber 2, and a preset process is performed. A pressure sensor 6 for measuring the pressure within the process chamber 2 is attached to the process chamber 2, and the pressure of the gas within the process chamber 2 is constantly monitored by this pressure sensor 6.

(1. Valve)

A horizontal rotary gate valve in which the plate swings in a horizontal direction within a casing is employed as the valve 4, due to advantages in terms of space, and relative ease of production. However, provided that the pressure within the process chamber 2 can be regulated appropriately, there is no limitation as to the design of the valve, and a pendulum valve, butterfly valve, poppet valve, or other vacuum valve could be used as well. Moreover, the design is not limited to one in which an O-ring slides against the casing during lifting and lowering of the plate of valve, and a greaseless valve design in which the plate is lifted and lowered within a casing of the valve such as a bellows, by a lifting/lowering member which is contactless with respect to the casing as a bellows, could be used as well. In this case, the process chamber 2 interior can be sealed by bringing the plate into close contact against the casing by a magnet (not illustrated).

(2. Controller)

Figure 3:
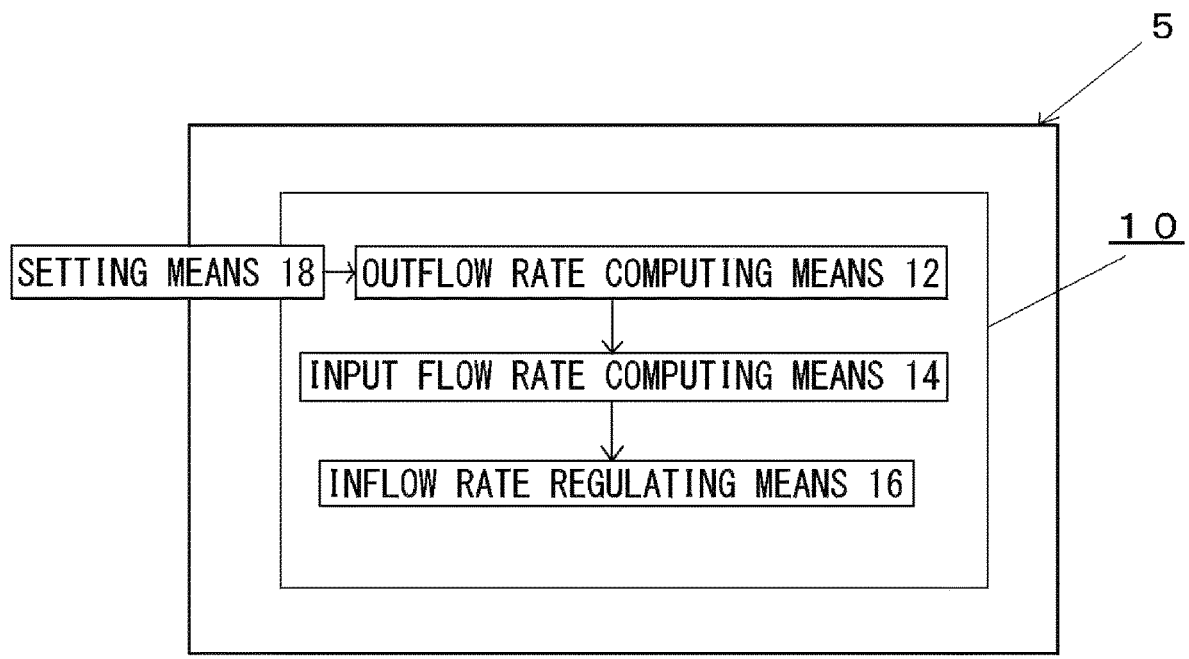
FIG. 3 is a conceptual diagram of the pressure control device of the present invention.

The controller 5 controls the operation, i.e. opening, closing, and the like, of the valve 4. As shown in FIG. 3, the pressure control device 10 of the present invention is set in the controller 5. By displacing the valve 4 to a preset position to regulate the opening thereof, the pressure control device 10 controls the pressure of gas within the process chamber 2 to a target pressure (pressure setpoint). Specifically, as shown in FIG. 3, this pressure control device 10 is provided with an outflow rate computing means 12 for computing a predicted outflow rate (Qo) at which gas is discharged from the process chamber 2 via the vacuum pump 3 by the suction of the vacuum pump 3; an input flow rate computing means 14 for calculating an input flow rate (Qi) at which it is necessary for gas to flow into the process chamber 2 in order to reach the target pressure; and an inflow rate regulating means 16 for regulating the inflow rate of gas inflowing to the process chamber 2, doing so on the basis of the input flow rate (Qi) calculated by the input flow rate computing means 14.

(3. Input Flow Rate Computing Means)

Specifically, the input flow rate computing means 14, using a known volume (V) of the process chamber and a pressure change rate ($\Delta P/\Delta t$) obtained from the current pressure ($P_1$: the unit is mTorr) within the process chamber 2, as measured by the pressure sensor 6, to reach a preset target pressure (Psp: the unit is mTorr) within the process chamber 2, which rate is derived from the differential between the current pressure ($P_1$) and the target pressure (Psp), calculates the input flow rate (Qi: the unit is mTorr·L/s) at which it is necessary for gas to flow into the process chamber 2 in order to reach the target pressure (Psp), doing so on the basis of the expression Qi=Qo+(P/$\Delta$t)V, where Qo (the unit is mTorr·L/s) is the pumping rate from the vacuum pump 3.

Noting the fact that in the fluid system of the semiconductor production device 10, as a fundamental rule, the pressure change rate ($\Delta P/\Delta t$) is derived from the gas inflow rate (Qi), the gas outflow rate (Qo), and the volume (V) of the treatment chamber 2 by the expression $\Delta P/\Delta t=(Qi-Qo)/V$, this expression is then transformed into an expression for deriving the required inflow rate (Qi), to arrive at Qi=Qo+($\Delta P/\Delta t$)V. In this case, the current pressure ($P_1$) within the treatment chamber 2 is measured by the pressure sensor 6 and is known, while at the same time, the target pressure (Psp) has been set beforehand as the pressure setpoint, and therefore the pressure change rate ($\Delta P/\Delta t$) required for the current pressure ($P_1$) to reach the target pressure (Psp) can be calculated from this data. Moreover, the volume (V) of the treatment chamber 2 is a known value for each maker and model, and can therefore be utilized as data as well. Consequently, once the current gas outflow rate (Qo) is known, the inflow rate (Qi) of gas required to bring the treatment chamber 2 interior to the target pressure (Psp) can be calculated. Here, "$\Delta P/\Delta t$" is the rate (the slope of the change when the time of change is plotted on the horizontal axis and the pressure is plotted on the vertical axis) of change over time of the pressure inside the treatment chamber 2. Specifically, the "pressure change rate ($\Delta P/\Delta t$)" is the time differential value of the gas pressure in the treatment chamber 2, and in this sense, the "pressure change rate ($\Delta P/\Delta t$) required for the current pressure (P) to reach the target pressure (Psp)" becomes, specifically, "$\Delta P_1/\Delta t$," but the expression "$\Delta P/\Delta t$" is generally substituted as a general expression for the "pressure change rate," i.e., to indicate the "pressure change rate" itself. The coincidental use of this expression is due to the fact that the expression Qi=Qo+($\Delta P/\Delta t$)V obtains from the fundamental rule that the "pressure change rate ($\Delta P/\Delta t$)" is calculated from the gas inflow rate (Qi), the gas outflow rate (Qo), and the volume (V) of the treatment chamber 2 according to the expression "$\Delta P/\Delta t=(Qi-Qo)/V$" in the fluid system of the semiconductor production device 1 (*1).

(4. Outflow Rate Computing Means)

Figure 12:
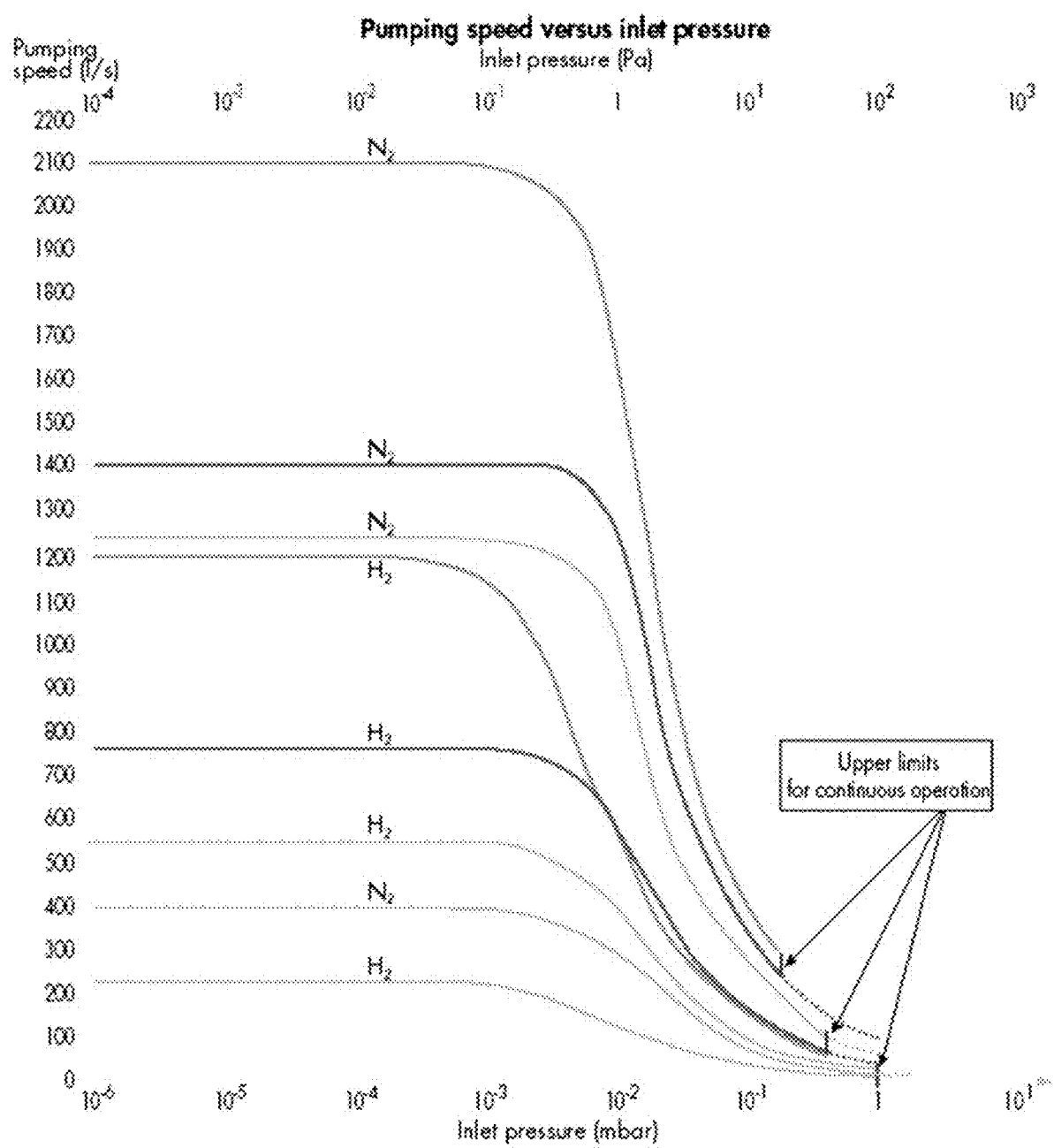
FIG. 12 is a graph showing a characteristic pumping rate at preset pressure, of each class of the vacuum pumps employed in the present invention.

The outflow rate computing means 12 is responsible for calculating the current outflow rate (Qo) of gas. Specifically, the outflow rate computing means 12 derives the current predicted outflow rate Qo(n) at which gas is discharged from the treatment chamber 2, from the current pressure ($P_2$: the unit being mTorr) within the suction pump 3 and the known characteristic suction rate (Sp: the unit being L/s) of the suction pump 3 under prescribed pressure. For gas such as source gas and the like, in cases in which this flow rate thereof is ascertained in terms of a mass flow rate, the rate can be ascertained as flow rate (Q)=pressure (P)*volume flow rate (suction rate: S), i.e., Q=PS, as indicated by the basic equation in FIG. 5; accordingly, the rate is affected by the pressure ($P_2$) within the suction pump 3 on the discharge side, and moreover the flow rate is known to actually change in the manner shown in FIG. 4 and FIG. 12, due to pressure within the suction pump 3. Therefore, as shown by the example in FIG. 12, a known characteristic suction rate (Sp) for each of the suction pumps 3 under prescribed pressure is derived as $Sp=f_1(P_2)$, from the example graph of FIG. 12. In view of the fact that "Qo(n)" refers to the current "predicted" outflow rate, and that the notation "n" therefore specifies the "current outflow rate," Qo(n) refers to the calculated outflow rate at the current time, and the substitute notation "n" is used simply because this outflow rate is a "predicted" outflow rate that is a hypothetical variable (an unknown or indefinite value). Specifically, the current outflow rate is specified using the notation "n" because "Qo(n)" is a predicted value and is a variable that is constantly and repeatedly calculated, and is expressed using "n," which is commonly used in the field of feedback control by digital processing as a substitute notation for indicating a variable that is a hypothetical value.

Figure 5:
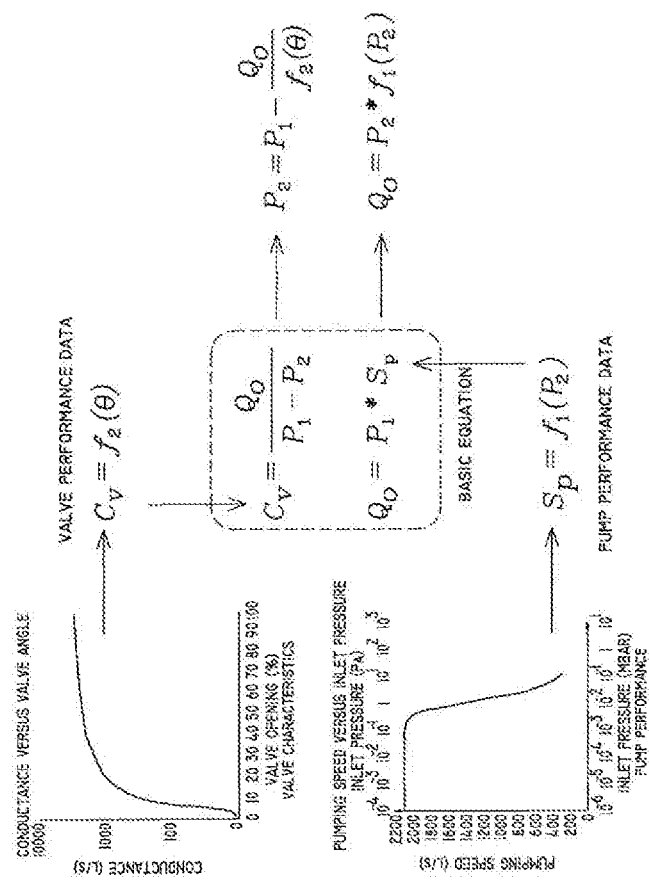
FIG. 5 is a diagram showing functions employed in the course of calculating the current predicted outflow rate at which gas is discharged from the process chamber, in the pressure control method of the prior art.

As shown in FIG. 5, the current predicted outflow rate Qo(n) at which gas is discharged from the process chamber 2 via the vacuum pump 3 is derived by substituting the afore-described function $Sp=f_1(P_2)$ into the afore-described expression Q=PS, i.e., for Sp in the expression $Qo=P_2*Sp$ for the problematic outflow rate from the vacuum pump 3 side. Specifically, as shown in FIG. 4, the outflow rate computing means 12 calculates the current outflow rate Qo(n) at which gas is discharged from the vacuum pump 3 side, in terms of the expression $Qo(n)=P_2*f_1(P_2)$, from the afore-described known pumping rate ($Sp=f_1(P_2)$) of each of the vacuum pump 3. Consequently, once the current pressure ($P_2$) within the vacuum pump 3 is known, the current predicted outflow rate (Qo(n)) at which gas is discharged from the process chamber 2 can be calculated.

In this case, according to the present invention, the outflow rate computing means 12 calculates the current pressure ($P_2$) within the vacuum pump 3 in the following manner. Specifically, as shown in FIG. 5, the characteristic conductance of the valve 4 is physically determined beforehand, by the opening/closing angle (θ) at a given position of the gate of the valve 4. The conductance Cv associated with a given aperture (θ) of the valve 4 is governed by factors such as the opening of the valve 4, the diameter of the gate, and the like, and is a known value for each maker and model. A functional curve Cv=$f_2$(θ) can be derived as shown in FIG. 5, and utilized as data.

Meanwhile, noting the fact that the conductance Cv (the unit being L/s) of the valve 4 is specified by the expression Cv=Qo/($P_1$−$P_2$) from the outflow rate (Qo), the pressure ($P_1$) within the treatment chamber 2, and the pressure ($P_2$) within the suction pump 3, as shown in FIG. 5, this expression is then transformed to $P_2$=$P_1$−(Qo/Cv) as an expression for deriving the pressure ($P_2$) within the suction pump 3. Then, by specifying the opening/closing angle (θ) associated with the current position of the switching plate of the valve 4, to thereby substitute the conductance of the valve 4 at the opening/closing angle (θ) associated with the current position of the switching plate of the valve 4 for the Cv (the conductance of the valve 4) in this numerical expression, the current pressure ($P_2$) of gas within the suction pump 3 can be calculated.

In this case, the current pressure ($P_2$) of the gas within the suction pump 3 has been calculated according to the expression $P_2$=$P_1$−(Qo(n−1)/$f_2$(θ)) by substituting the known "characteristic conductance (Cv=$f_2$(θ))" of the valve 4 at the opening/closing angle (θ) associated with the current position of the switching plate of the valve 4, as shown in FIGS. 4 through 6(A), as the conductance of the valve 4 to be inputted. (Furthermore, the reason that the notation "Qo(n−1)" is used is that, in the present invention as described hereinafter, the required inflow rate (Qi) at which it is necessary for gas to flow into the treatment chamber 2 is calculated repeatedly at a loop time of 5 msec (about 0.05 seconds), in which sense "Qo(n−1)" is overall (itself) the predicted outflow rate calculated at the time of the previous calculation processing, and as a result, the notation "n−1" is used as a substitute notation for specifying that the value is that of the previous calculation processing.)

Figure 7:
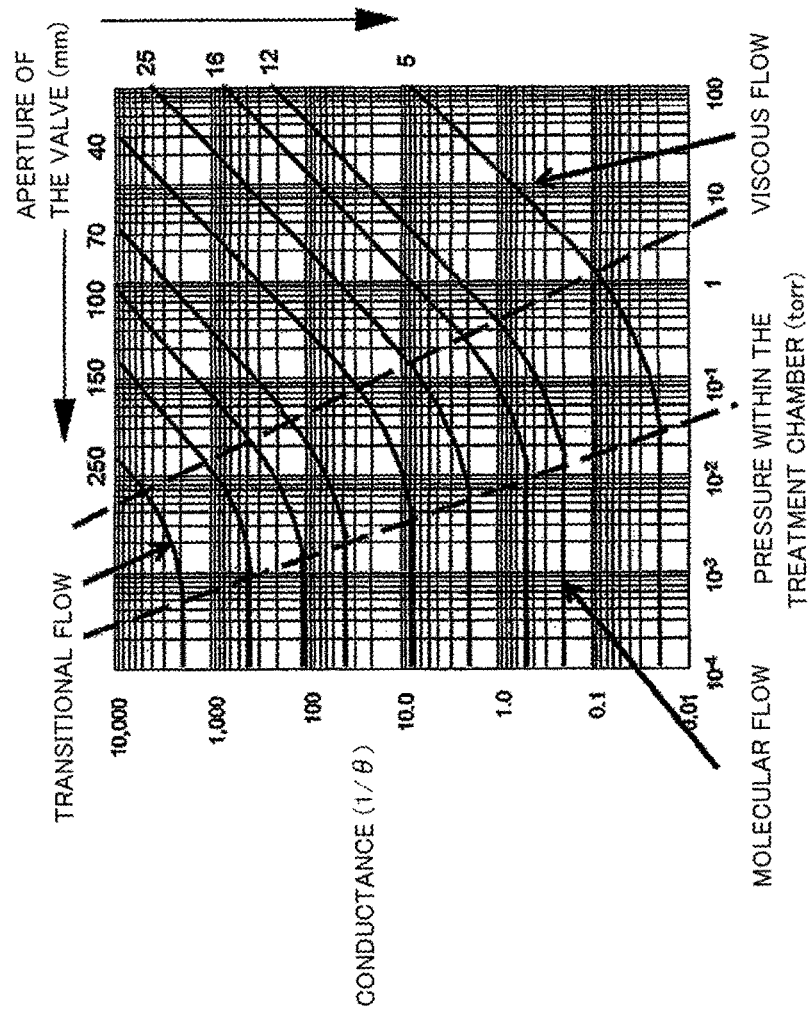
FIG. 7 is a general graph showing the relationship between the physically determined valve conductance, the pressure within the treatment chamber, and the opening degree of the valve.

Specifically, the current pressure ($P_2$) within the suction pump 3 was conventionally calculated by taking into account only a single conductance specified by a relationship with a given pressure at a given opening/closing angle (θ) of the switching plate of the valve 4, as shown in FIG. 8(A), i.e., on the basis of only the conductance (a pre-set fixed specified value (value learned by the system in advance)) for a single gas flow at the current time, but the actual conductance is not determined solely by the relationship with each opening/closing angle (θ), and in reality changes according to pressure as well, as shown in FIGS. 7 and 8(B). Specifically, because the conductance (Cv) of the valve 4 is represented by the expression Cv=Q/($P_1$−$P_2$), by the relationship between the flow rate (Q) and the pressure difference ($P_1$−$P_2$) between the pressure ($P_1$) within the treatment chamber 2 and the pressure ($P_1$) within the suction pump 3, the conductance of the valve 4 is physically determined by the relationship between the opening/closing angle (θ) of the switching plate of the valve 4 and the pressure within the treatment chamber 2, as shown in FIG. 7, and is actually affected by the pressure within the suction pump 3 and the treatment chamber 2, which is constantly changing even during minute time periods, and the pressure difference thereof (and consequently by changes in the pressure within the treatment chamber 2) particularly in transitional flow, which is the practical zone of actual use (pressures of $10^{-4}$ and the like in other zones not being at a practical level), as is understood from FIG. 7, FIG. 7 being a function graph illustrating this general relationship. Consequently, by calculating the current pressure ($P_2$) within the suction pump 3, having derived a more accurate conductance by also taking into account the change in pressure, and consequently pressure difference, within the abovementioned minute time period, it is possible to more appropriately calculate the current predicted outflow rate (Qo(n)) and consequently the required inflow rate (Qi).

Accordingly, in the present invention, rather than simply using the conductance of the valve 4, which is a fixed value learned in advance, the degree of change in the conductance is taken into account as well to derive a more accurate conductance, and the current pressure ($P_2$) within the suction pump 3 is calculated. Specifically, the current pressure ($P_2$) within the suction pump 3 is calculated according to the expression $P_2$=$P_1$−(Qo(n−1)/$f_2$(θ, P)), as shown in FIG. 6(B), from the accurate conductance (Cv(θ, P)=$f_2$(θ, P)) calculated by adding the error between the current pressure ($P_1$) actually measured within the treatment chamber 2 and a known specified pressure (P) within the treatment chamber at the characteristic conductance (Cv=$f_2$(θ)) of the valve 4 at the opening/closing angle (θ) associated with the current position of the switching plate of the valve 4 to the known characteristic conductance (Cv=$f_2$(θ)) of the valve 4 at the opening/closing angle (θ) associated with the current position of the switching plate of the valve, and the current predicted outflow rate Qo(n) at which gas is discharged from the treatment chamber 2 is calculated.

Figure 11:
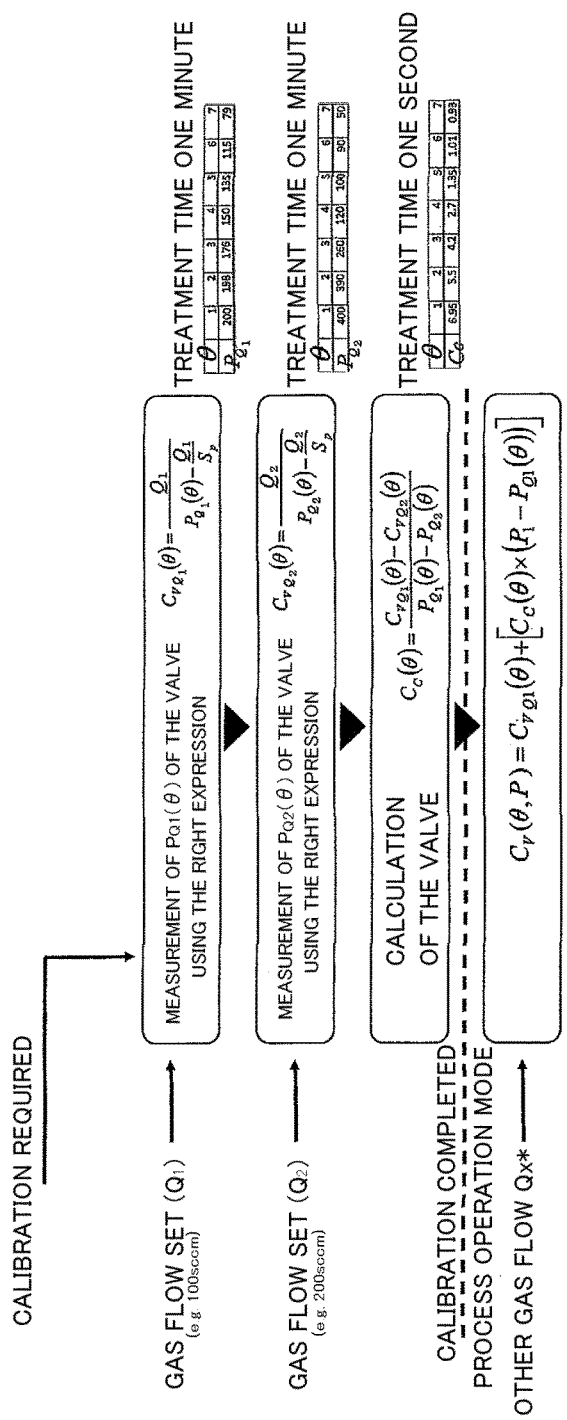

In this case, the outflow rate computing means 12 calculates the accurate conductance (Cv(θ, P)=$f_2$(θ, P)) specifically as described below. First, the outflow rate computing means 12 establishes and stored in advance a correction value (Cc(θ)) specified by taking into account the change in conductance of the valve 4 and the change in pressure within the treatment chamber 2 for each of the opening/closing angles (θ) of the switching plate of the valve 4, as shown in FIGS. 8(B) through 11. Then, the outflow rate computing means 12 calculates the accurate conductance (Cv(θ, P)=$f_2$(θ, P)) according to the expression Cv(θ, P)=$Cv_{Q1}$(θ)+[Cc(θ)×($P_1$−$P_{Q1}$(θ))] from the calculated value ($Cv_{Q1}$(θ)) of the conductance of the valve 4 at the opening/closing angle (θ) associated with the current position of the switching plate of the valve 4, the calculated value ($P_{Q1}$(θ)) of the known specified pressure within the treatment chamber 2 at the conductance ($Cv_{Q1}$(θ)), and the corresponding correction value (Cc(θ)) for the current pressure ($P_1$) actually measured within the treatment chamber 2 and the opening/closing angle (θ) associated with the current position of the switching plate of the valve 4, as shown in FIGS. 10 and 11.

The reason for this is that, while using as a base the calculated value ($Cv_{Q1}$(θ)) of the conductance of the valve 4 at the opening/closing angle (θ) associated with the current position of the switching plate of the valve 4, i.e., the value of the specified characteristic conductance at the initial time (current time) in the initial stage of calculation, which is the value calculated as the last value of the conductance when the conductance is repeatedly and continuously calculated by feedback (in the second and subsequent computations), because the current pressure ($P_1$) actually measured within the treatment chamber and the calculated value ($P_{Q1}$(θ)) of the known specified pressure within the treatment chamber 2 at the corresponding conductance ($Cv_{Q1}$(θ)) do not necessarily match due to the fact that the pressure within the treatment chamber 2 constantly changes even in minute ranges of time, the accurate conductance ($Cv(\theta, P)=f_2(\theta, P)$) can meanwhile be derived by deriving the conductance difference (offset) using the correction value ($Cc(\theta)$) from the error ($P_1-P_{Q1}(\theta)$) of the pressures and considering the aforementioned conductance difference in the calculated value ($Cv_{Q1}(\theta)$) of the conductance of the valve 4 at the opening/closing angle ($\theta$) associated with the current position of the switching plate of the valve 4.

Explaining this using FIG. 9(B), the pressure within the treatment chamber 2 (horizontal axis in FIG. 9(B)) changes from the calculated value ($P_{Q1}(\theta)$) of the known specified pressure within the treatment chamber 2 at the calculated value ($Cv_{Q1}(\theta)$: i.e., the value of the specified (learned) characteristic conductance at the initial time (current time) in the initial stage of calculation, which is the value calculated as the last value of the conductance when the conductance is repeatedly and continuously calculated by feedback (in the second and subsequent computations), as described above) of the conductance of the valve 4 at the opening/closing angle ($\theta$) associated with the current position of the switching plate of the valve 4 to the current pressure ($P_1$) actually measured within the treatment chamber 2 during the minute time period taken for computational processing (horizontal axis in FIG. 9(B)), and during this time, in corresponding fashion, the conductance of the valve 4 also changes (vertical axis in FIG. 9(B)) from the calculated value ($Cv_{Q1}(\theta)$) of the conductance of the valve 4 at the opening/closing angle ($\theta$) associated with the current position of the switching plate of the valve 4 to a current conductance (actual conductance at the current time), i.e., to the accurate conductance ($Cv(\theta, P)=f_2(\theta, P)$). Consequently, by determining the ratio, i.e., the slope, of this change, the amount of change in the conductance can also be calculated from the error ($P_1-P_{Q1}(\theta)$) of the pressures.

As understood from the above, the correction value ($Cc(\theta)$) used in the present invention is a pre-calculated and established ratio of the degree to which the conductance changes with respect to the degree of change in the pressure within the treatment chamber 2, and because the amount of change in the conductance varies for each opening/closing angle ($\theta$) of the switching plate of the valve 4, the correction value ($Cc(\theta)$) is calculated and established in advance for each opening/closing angle ($\theta$) of the switching plate of the valve 4, as shown in FIGS. 10 and 11. In this case, the ratio (slope) of the change is approximately constant in the transitional flow range, which is the practical zone in the graph of the function indicating the relationship between the physically determined characteristic conductance of the valve 4 and the pressure within the treatment chamber 2, as shown in FIG. 7. Therefore, in the present invention, the accurate conductance $Cv(\theta, P)$ is calculated by calculating the correction value ($Cc(\theta)$) from the expression $Cc(\theta)=Cv_{Q1}(\theta)-Cv_{Q2}(\theta)/P_{Q1}(\theta)-P_{Q2}(\theta)$ as the general relationship of the ratio of the change in the characteristic conductance ($Cv_{Q2}(\theta)$, $Cv_{Q2}(\theta)$) of the valve 4 and the pressure ($P_{Q1}(\theta)$, $P_{Q2}(\theta)$) within the treatment chamber 2 between two gas flow rates ($Q_1$, $Q_2$) arbitrarily selected within the transitional flow range, which is the practical zone, in the graph (FIG. 7) of the function indicating the relationship between the physically determined characteristic conductance of the valve 4 and the pressure within the treatment chamber 2, calculating and storing in advance the correction value ($Cc(\theta)$) for each opening/closing angle ($\theta$) of the switching plate of the valve, and selecting the correction value ($Cc(\theta)$) that corresponds to the opening/closing angle ($\theta$) in accordance with the opening/closing angle ($\theta$) associated with the current position of the switching plate of the valve and inputting the selected correction value into the expression $Cv(\theta, P)=Cv_{Q1}(\theta)+[Cc(\theta)\times(P_1-P_{Q1}(\theta))]$, as shown in FIGS. 9(A), 10, and 11. Specifically, in the transitional flow range, which is the practical zone, in the graph of the function indicating the relationship between the physically determined characteristic conductance of the valve 4 and the pressure within the treatment chamber 2, the ratio (slope) of the change is approximately constant, and the relationship of the ratio of the change in the characteristic conductance ($Cv_{Q1}i(\ )$, $Cv_{Q2}(\theta)$) of the valve 4 and the pressure ($P_{Q1}(\theta)$, $P_{Q2}(\theta)$) within the treatment chamber 2 between two gas flow rates ($Q_1$, $Q_2$) arbitrarily selected within the transitional flow range can therefore be replaced, without modification, with the relationship between the calculated value ($Cv_{Q1}(\theta$ (*2): i.e., the value of the specified (learned) characteristic conductance at the initial time (current time) in the initial stage of calculation, which is the value calculated as the last value of the conductance when the conductance is repeatedly and continuously calculated by feedback (in the second and subsequent computations), as described above) of the conductance of the valve 4 at the opening/closing angle ($\theta$) associated with the current position of the switching plate of the valve 4 and the specified corresponding conductance at the pressure ($P_1$) actually measured within the treatment chamber 2, i.e., the (current and actual) accurate conductance ($Cv(\theta, P)=f_2(\theta, P)$), as shown in FIG. 9(B).

Here, since the conductance ($Cv$) is indicated by the expression $Cv=Q/(P_1-P_2)$ as shown in FIG. 10 from the relationship between the flow rate ($Q$) and the pressure difference ($P_1-P_2$), and the pressure ($P$) is specified by the expression $P=Q/Sp$ from the relationship between the flow rate ($Q$) and $Sp$ (suction rate), the non-measurable unknown (current) gas pressure ($P_2$) within the suction pump 3 can be calculated by substitution into $Q/Sp$, and therefore, the conductance at a certain opening/closing angle ($\theta$) of the switching plate of the valve 4 can be derived from the expression $Cv(\theta)=Q/[P(\theta)-(Q/Sp)]$. Consequently, in deriving the correction value ($Cc(\theta)$), in the present invention, the characteristic conductances ($Cv_{Q1}(\theta)$, $Cv_{Q2}(\theta)$) of the valve at the two gas flow rates ($Q_1$, $Q_2$) arbitrarily selected within the transitional flow range, which is the practical zone, are calculated in advance for each opening/closing angle ($\theta$) of the switching plate of the valve according to the expressions $Cv_{Q1}(\theta)=Q_1/[P_{Q1}(\theta)-(Q_1/Sp)]$ (conventionally, only this single conductance was employed, as shown in FIG. 8(A) and the top level of FIG. 10) and $Cv_{Q2}(\theta)=Q_2/[P_{Q2}(\theta)-(Q_2/Sp)]$, respectively, from the two gas flow rates ($Q_1$, $Q_2$), the pressures ($P_{Q1}(\theta)$, $P_{Q2}(\theta)$) within the treatment chamber 2 measured at the two gas flow rates ($Q_1$, $Q_2$), and the known characteristic suction rate ($Sp$) of the suction pump 3, as shown in FIGS. 10 and 11, and the correction value ($Cc(\theta)$) can be calculated by inputting the calculated conductances ($Cv_{Q1}(\theta)$, $Cv_{Q2}(\theta)$) and the pressures ($P_{Q1}(\theta)$, $P_{Q2}(\theta)$) within the treatment chamber 2 measured at the two gas flow rates ($Q_1$, $Q_2$) into the expression $Cc(\theta)=Cv_{Q1}(\theta)-Cv_{Q2}(\theta)/P_{Q1}(\theta)-P_{Q2}(\theta)$.

Figure 9:
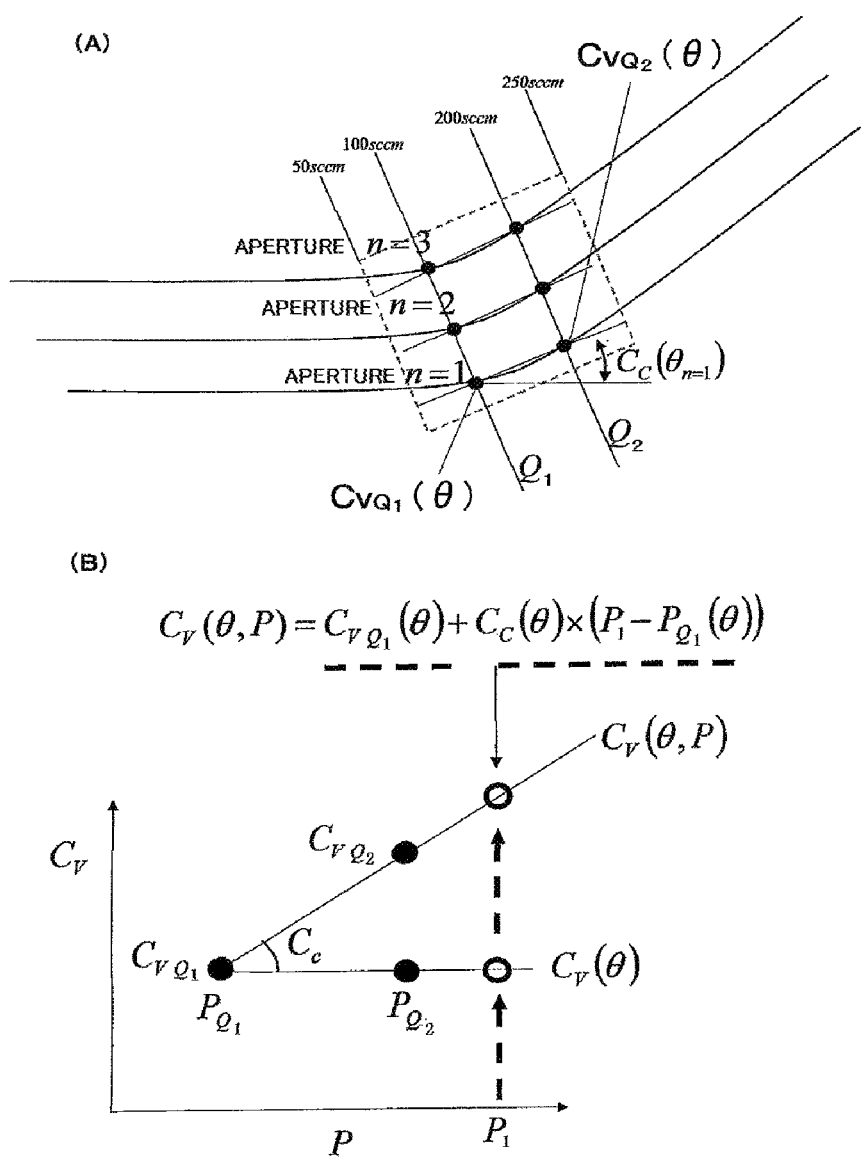
FIG. 9 is a graph for deriving the valve conductance in the present invention.

In this case, as shown in FIG. 9(A), the gas flow rate ($Q$) values of 100 sccm and 200 sccm, for example, are preferably used as the two gas flow rates ($Q_1$, $Q_2$) arbitrarily selected within the transitional flow range, which is the practical zone, (see FIG. 7). The reason for selecting these values is that any change in conductance that is sudden (according to a quadratic function) occurs exclusively between 100 sccm and 200 sccm, regardless of the opening/closing angle ($\theta$) of the switching plate of the valve 4, and it is therefore sufficient to adopt this upper limit and lower limit, and meanwhile, the ratio of the change in conductance is approximately constant in this interval, i.e., the change can be specified by a single quadratic function, as shown in FIG. 9(A). In the above embodiment, however, the correction value is calculated according to the expression $Cc(\theta) = Cv_{Q1}(\theta) - Cv_{Q2}(\theta)/P_{Q1}(\theta) - P_{Q2}(\theta)$, and is therefore a straight line of a linear function, as shown in FIG. 9. However, in contrast with the embodiment described above, the correction value ($Cc(\theta)$) can also be calculated as the quadratic function curve shown in FIG. 9(A) in order to derive a more accurate conductance.

In calculation of the correction value ($Cc(\theta)$), the opening/closing angle ($\theta$) of the switching plate of the valve 4 is set as 100 stages of 1% to 100%, and the correction value ($Cc(\theta)$) is calculated at all of the percentages of the opening/closing angle ($\theta$) from 1% to 100%, as shown in FIG. 11. Specifically, during operation of the pressure control device 10 (*3) of the present invention, the gas flow rate (Q) is set in advance to each of the above-described values 100 sccm or 200 sccm, for example, gas is circulated at the constant flow rate (Q) thus set, and the pressure ($P_{Q1}(\theta)$, $P_{Q2}(\theta)$) within the treatment chamber 2 is measured by the pressure sensor 6 for each opening/closing angle ($\theta$) from 1% to 100% at the constant flow rate, after which the characteristic conductances ($Cv_{Q1}(\theta)$, $Cv_{Q2}(\theta)$) of the valve 4 at the two gas flow rates ($Q_1$ (=100 sccm), $Q_2$ (=200 sccm) arbitrarily selected within the transitional flow range, which is the practical zone, are calculated according to the expressions $Cv_{Q1}(\theta) = Q/[P_{Q1}(\theta) - (Q_1/Sp)]$ and $Cv_{Q2}(\theta) = Q_2/[P_{Q2}(\theta) - (Q_2/Sp)]$, respectively (i.e., the conductances ($Cv_{Q1}(\theta)$, $Cv_{Q2}(\theta)$) in the graph (shown in the graph) are derived by computation on the basis of a function indicating the relationship between the physically determined characteristic conductance of the valve 4 shown in FIGS. 7 and 9(A) and the pressure within the treatment chamber 2). In the operation described above, the conductance of the valve 4 in a relevant location can be derived when the flow rate (Q) and the pressure (P) within the treatment chamber 2 are known, and the conductances ($Cv_{Q1}(\theta)$, $Cv_{Q2}(\theta)$) can therefore be calculated by setting the two gas flow rates ($Q_1$, $Q_2$) in advance (100 sccm, 200 sccm) and measuring the pressure (P) within the treatment chamber 2 for each opening/closing angle ($\theta$) at the corresponding flow rates. About 1 minute is required for this processing time. Then, the calculated conductances ($Cv_{Q1}(\theta)$, $Cv_{Q2}(\theta)$) from the characteristic conductances ($Cv_{Q1}(\theta)$, $Cv_{Q2}(\theta)$) of the valve 4 at the two gas flow rates ($Q_1$, $Q_2$) arbitrarily selected within the transitional flow range, which is the practical zone, calculated as described above and the pressures ($P_{Q1}(\theta)$, $P_{Q2}(\theta)$) within the treatment chamber 2 measured at the two gas flow rates ($Q_1$, $Q_2$) are inputted to the expression $Cc(\theta) = Cv_{Q1}(\theta) - Cv_{Q2}(\theta)/P_{Q1}(\theta) - P_{Q2}(\theta)$ as shown in FIG. 11, and the correction value ($Cc(\theta)$) is calculated. The numerical values of $P_{Q1}$, $P_{Q2}$, and Cc in FIG. 11 are provisional.

By the processing described above, it is possible to even more accurately calculate the required inflow rate (Qi) at which it is necessary for gas to flow into the treatment chamber 2 to reach the target pressure in response also to changes in the pressure within the treatment chamber 2. Specifically, although only a specified characteristic (single point of) data that was simply pre-established and learned was taken into account as the conductance of the valve 4 in the prior art, changes in the pressure within the treatment chamber 2 that occur constantly even in minute time periods are taken into account in advance in the present invention by the correction value ($Cc(\theta)$) established considering the conductance at two flow rates and the change in the pressure within the treatment chamber 2, and a more accurate actual conductance is calculated, and the pressure can therefore be more accurately controlled.

Figure 8:
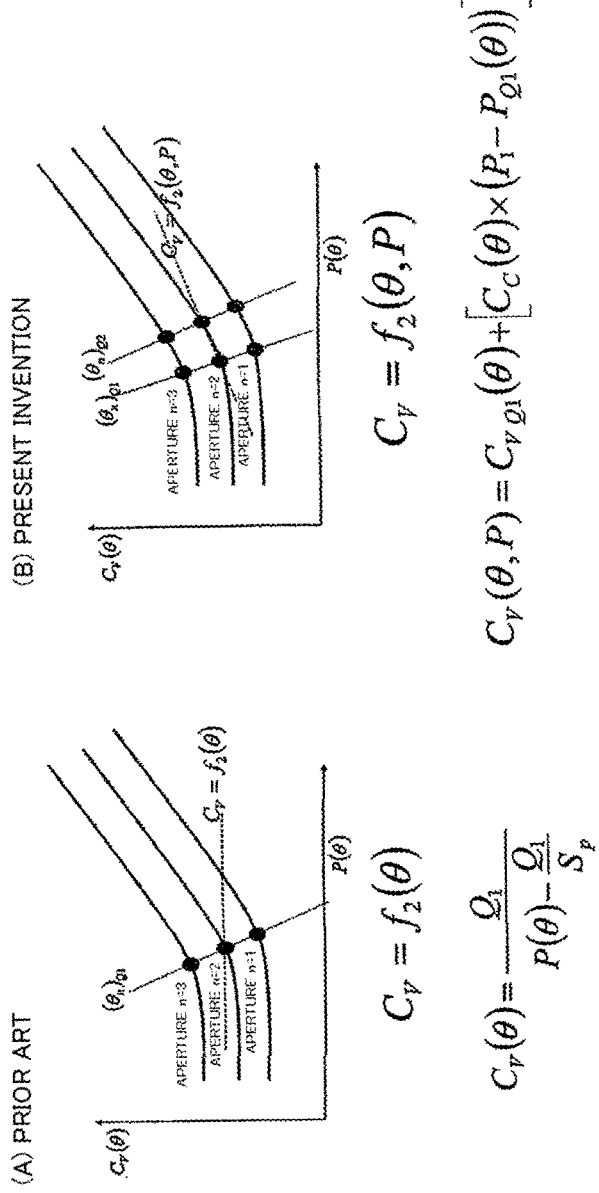
FIG. 8 is a diagram showing a comparison between the specification method of the present invention and the conventional method for specifying the valve conductance for calculating the gas pressure within the suction pump.

The outflow rate computing means 12 thus calculates the accurate conductance ($Cv(\theta, P) = f_2(\theta, P)$) on the basis of the expression $Cv(\theta, P) = Cv_{Q1}(\theta) + [Cc(\theta) \times (P_1 - P_{Q1}(\theta))]$ as shown in FIGS. 8, 10, and 11, inputs the calculated accurate conductance ($Cv(\theta, P) = f_2(\theta, P)$) for the term "$f_2(\theta, P)$" in the expression $P_2 = P_1 - (Qo(n-1)/f_2(\theta, P))$ shown in FIG. 6(B), and calculates the current gas pressure ($P_2$) within the suction pump 3. By substituting the current gas pressure ($P_2$) within the suction pump 3 thus calculated for $P_2$ (both "$P_2$" and $f_1$("$P_2$")) in the abovementioned expression $Qo(n) = P_2 * f_1(P2)$ as shown in FIG. 6(B), the outflow rate computing means 12 can calculate the current predicted outflow rate (Qo(n)) at which gas is discharged from the treatment chamber 2.

In this case, as shown in FIG. 6(B), the outflow rate computing means 12 feeds back the calculated current predicted outflow rate Qo(n) of gas, through re-input thereof in the form of the term $Qo(n-1)/f_2(\theta, P)$ in the afore-described expression $P_2 = P_1(Qo(n-1)/f_2(\theta))$, and further substitutes the thusly calculated $P_2$ for the terms $P_2$ and $f_1(P_2)$ in the expression $Qo(n) = P_2 * f_1 (P_2)$, in order to calculate the current predicted outflow rate Qo(n) of gas. The input flow rate computing means 14 constantly calculates the input flow rate (Qi) at which it is necessary for gas to flow into the process chamber 2 to reach the target pressure (Psp), according to change in the current pressure ($P_2$) within the vacuum pump 3, doing so on the basis of the current predicted outflow rate Qo(n) calculated by the outflow rate computing means 12. In so doing, the input flow rate (Qi) at which it is necessary for gas to flow into the process chamber 2 to reach the target pressure can be correctly calculated, and the gas pressure within the process chamber 2 accurately controlled to the preset target value (pressure setpoint), rapidly in a constant and instantaneous manner in response to changes in pressure.

In the illustrated embodiment, the current pressure ($P_2$) of gas within the vacuum pump 3 is derived through a function; the basis for doing so is that it is difficult for the pressure ($P_2$) within the vacuum pump 3 to be measured by a sensor, because the fins are rotating at high speed within the vacuum pump 3, and because, due to space considerations, it is difficult to situate a sensor inside the vacuum pump 3 due to the size of the sensor. However, there is no limitation to a process that relies on this function, and in cases in which pressure ($P_2$) within the vacuum pump 3 can be measured by a sensor, the current pressure ($P_2$) within the vacuum pump 3 could be derived through measurements made by a sensor situated in the vacuum pump 3.

(5. Inflow Rate Regulating Means)

In cases in which the input flow rate (Qi) has been calculated in this manner, as shown in FIG. 4, because the characteristic conductance ($Cv = f_2(\theta)$) of the valve 4 associated with the opening/closing angle ($\theta$) at a given position of the gate of the valve 4 is known, the inflow rate regulating means 16 will displace the gate (not illustrated) to a position equivalent to a preset opening/closing angle ($\theta$), to obtain a specific conductance (Cv) necessary for the valve 4 to ensure the input flow rate (Qi), and control the pressure within the process chamber 2 to the target pressure (Psp).

(6. Setting Means)

In the afore-described embodiment, the outflow rate computing means 12 stores in advance, for each class of the valves 4 (each maker and model), the characteristic conductance ($Cv = f_2(\theta)$) of the valve 4 at the opening/closing angle (θ) associated with the current position of the gate of the valve 4, and likewise stores in advance, for each class of the vacuum pumps 3 (each maker and model), the characteristic pumping rate (Sp=$f_1(P_2)$) of the vacuum pump 3 at preset pressure. In so doing, the need to operate the system once with dummy wafers make the system learn each combination of process chamber 2, vacuum pump 3, and valve 4, as well as to perform a reset each time that these combinations change, is obviated, whereby ample versatility is achieved, while at the same time accurately accommodating different combinations of valves 4 and vacuum pumps 3, without the need for time and labor to make settings before running the system.

In this case, as shown in FIG. 3, the controller 5 is further equipped with setting means 18 which can switch the class of valves 4 and vacuum pumps 3. In specific terms, the setting means 18 can be constituted by an interface, such as buttons, provided to the controller 5, whereby, simply by specifying the class of valve 4 and vacuum pump 3, the inputted characteristic pumping rate (Sp=$f_1(P_2)$) of the vacuum pump 3 can be switched in accordance with the class of the vacuum pump 3, and the inputted characteristic conductance (Cv=$f_2(\theta)$) of the valve 4 at the opening/closing angle (θ) associated with the current position of the gate of the valve 4 can be switched in accordance with the class of valve 4. In so doing, accurate settings to accommodate different combinations of valves 4 and vacuum pumps 3 can be made easily and quickly.

(7. Method of Use)

Next, the method of use of the pressure control method of the present invention will be described. Firstly, by way of advance preparation, for each of the vacuum pumps 3 it is predicted will be used, employing data published by the maker of the vacuum pump 3 in question, the known characteristic pumping rate (Sp=$f_1(P_2)$) of the vacuum pump 3 in question at preset pressure is stored in the outflow rate computing means 12, doing so for each class of the vacuum pumps (each maker and model); and for each of the valves 4 it is predicted will be used, employing data published by the maker of the valve 4 in question, the known characteristic conductance (Cv=$f_2(\theta)$) of the valve 4 at the opening/closing angle (θ) associated with the current position of the gate of the valve 4 in question is stored, doing so for each class of the valves 4 (each maker and model). The volume (V) of the process chamber 2 is also input to the outflow rate computing means 12. In cases in which a new model or vacuum pump 3 or valve 4 becomes available, or in cases of a change in the specs of a model, it is preferable to update or revise the data, so that the data stored in the outflow rate computing means 12 is always the latest version.

Next, in accordance with the class of the suction pump 3 and valve 4 for which settings are actually being made, the interface of the setting means 18 is used, to make settings for the suction pump 3 and the valve 4 in question through button operations or the like, and specify the inputted characteristic suction rate (Sp) of the suction pump 3 at predetermined pressure, and the characteristic conductance (Cv) of the valve 4 at the opening/closing angle (θ) associated with the current position of the switching plate of the valve 4. In this case, in the aforedescribed manner, appropriate parameters can be set simply by selecting the suction pump 3 and the valve 4 in question. Also at this time (before the start of operation), utilizing these items of data, the aforedescribed correction value (Cc(θ)) is also calculated in advance for each opening/closing angle (θ) of the switching plate of the valve 4 and stored.

Thereafter, in cases of actual regulation of gas pressure within the process chamber to a preset target value (pressure setpoint), firstly, it is assumed, by way of an initial value, that the gate of the valve 4 is normally in a fully-closed state immediately before the need for pressure control arises. In this state, because there is no outflow of gas from the downstream side (the vacuum pump 3 side) (because the vacuum pump is not operating), the current predicted outflow rate (Qo(n)) of gas infinitely approximates "0," and therefore when the current pressure within the vacuum pump 3 is derived in the outflow rate computing means 12, as shown in FIG. 6(B), a hypothetical value of "0" is input for the term "Qo(n−1)/$f_2(\theta, P)$" in the standard expression $P_2 = P_1 - Qo(n-1)/f_2(\theta)$ (i.e., $P_2 = P_1$ in a so-called steady state, the value of $P_1$ measured at this stage being input as-is as $P_2$ into the various functions), the characteristic conductance (Cv=$f_2(\theta)$) of the valve 4 at the opening/closing angle (θ) associated with the current position of the gate of the valve 4 is substituted into the term $f_2(\theta, P)$ in the same standard expression $P_2 = P_1 - Qo(n-1)/f_2(\theta, P)$, and the current gas pressure ($P_2$) within the vacuum pump 3 is calculated.

As shown in FIG. 4, the current gas pressure ($P_2$) within the vacuum pump 3 calculated in this manner is substituted by the outflow rate computing means 12 for the term "$P_2$" in the standard expression Qo(n)=$P_2 * f_1(P_2)$ used to calculate the predicted outflow rate Qo(n) of gas discharged from the process chamber 2 via the vacuum pump 3 by the suction of the vacuum pump 3, to thereby calculate the current predicted outflow rate Qo(n) of gas discharged from the process chamber 2.

Further, the current predicted outflow rate Qo(n) of gas calculated in this manner, as well as the target pressure (Psp) set beforehand as the pressure setpoint, and the input volume (V) of the process chamber 2, are included in the calculation of the expression Qi=Qo+($\Delta P/\Delta t$)V by the input flow rate computing means 14, to calculate the input inflow rate (Qi) of gas estimated for the process chamber 2 interior to reach the target pressure (Psp).

In this case, as shown in FIG. 6(B), in the outflow rate computing means 12, the calculated current predicted outflow rate Qo(n) of gas is fed back through re-input in the form of the term Qo(n−1) in the afore-described expression $P_2 = P_1(Qo(n-1)/f_2(\theta, P))$, and the thusly calculated $P_2$ is further substituted for the terms $P_2$ and $f_1(P_2)$ in the expression Qo(n)=$P_2 * f_1(P_2)$ to calculate the predicted outflow rate Qo(n−1); and in the input flow rate computing means 14, the input flow rate (Qi) at which it is necessary for gas to flow into the process chamber 2 to reach the target pressure (Psp), according to change in the current pressure ($P_2$) within the vacuum pump 3, is calculated in a constantly corrected manner, doing so on the basis of the current predicted outflow rate Qo(n) calculated by the outflow rate computing means 12. In this case, with the time required by the loop as short as possible, in specific terms, about 5 msec (0.05 second), the input flow rate (Qi) at which it is necessary for gas to flow into the process chamber 2 to reach the target pressure can be calculated accurately, doing so rapidly in a constant and instantaneous manner in response to changes in pressure, controlling the gas pressure within the process chamber 2 to the target pressure (pressure setpoint).

On the basis of the thusly calculated input flow rate (Qi) at which it is necessary for gas to flow into the process chamber 2 to reach the target pressure, the inflow rate regulating means 16 displaces the gate (not illustrated) to a position equivalent to a preset opening/closing angle (θ), so as to obtain a specific conductance (Cv) necessary for the valve 4 to ensure the input flow rate (Qi) as shown in FIG.

4, (Cv=$f_2(\theta)$), doing so through an inverse operation, since the specific conductance (Cv) of the valve 4 at the opening/closing angle ($\theta$) associated with a given position of the gate of the valve 4 is known. In so doing, the pressure within the process chamber is accurately controlled to the target pressure (Psp).

INDUSTRIAL APPLICABILITY

The present invention has a wide scope of application, in particular, to process chambers used in semiconductor device etching devices, or in CVD thin film processes or PVD, as well as in the manufacture of flat panel displays and the like.

Although some preferred embodiments of the invention have been described and illustrated with reference to the accompanying drawings, it will be understood by those skilled in the art that they are by way of examples, and that various changes and modifications may be made without departing from the spirit and scope of the invention, which is defined only to the appended claims.

What is claimed is:

1. A pressure control method for regulating the pressure of gas inside a treatment chamber in a semiconductor production step via a valve situated between the treatment chamber and a suction pump for suctioning gas from within the treatment chamber, wherein the method for controlling pressure in a treatment chamber is characterized in that a predicted outflow rate (Qo) at which gas is discharged from the treatment chamber via the suction pump by the suction of the suction pump is computed, and when a required inflow rate (Qi) at which it is necessary for gas to flow into the treatment chamber in order to reach a preset target pressure (Psp) within the treatment chamber is calculated on the basis of the expression Qi=Qo+(P/$\Delta$t)V from a known volume (V) of the treatment chamber, and a pressure change rate ($\Delta$P/$\Delta$t) required for the current pressure ($P_1$) within the treatment chamber to reach the target pressure (Psp) is calculated, the rate being derived from the difference between the current pressure ($P_1$) within the treatment chamber and the target pressure (Psp), and inflow of the calculated required inflow rate (Qi) into the treatment chamber is brought about and the pressure within the treatment chamber is controlled to the target pressure (Psp), in calculation of a current predicted outflow rate (Qo(n)) at which gas is discharged from the treatment chamber on the basis of the expression Qo(n)=$P_2$*$f_1(P_2)$, using a current pressure ($P_2$) within the suction pump and a known characteristic suction rate (Sp=$f_1(P_2)$) of the suction pump under prescribed pressure, the current pressure ($P_2$) within the suction pump is calculated according to the expression $P_2$=$P_1$−(Qo(n−1)/$f_2(\theta, P)$) from an accurate conductance (Cv($\theta$, P)=$f_2(\theta, P)$) calculated by adding the error between the current pressure ($P_1$) actually measured within the treatment chamber and a known specified pressure (P) within the treatment chamber at the characteristic conductance (Cv=$f_2(\theta)$) of the valve at the opening/closing angle ($\theta$) associated with the current position of the switching plate of the valve to the known characteristic conductance (Cv=$f_2(\theta)$) of the valve at the opening/closing angle ($\theta$) associated with the current position of the switching plate of the valve, and the current predicted outflow rate Qo(n) at which gas is discharged from the treatment chamber is calculated.

2. A method for controlling pressure in a treatment chamber according to claim 1, characterized in that, after a correction value (Cc($\theta$)) is established and stored in advance for each of the opening/closing angles ($\theta$) of the switching plate of the valve, the correction value (Cc($\theta$)) being specified by taking into account the change in conductance of the valve and the change in pressure within the treatment chamber, the accurate conductance (Cv($\theta$, P)=$f_2(\theta, P)$) is calculated according to the expression Cv($\theta$, P)=$Cv_{Q1}(\theta)$+[Cc($\theta$)×($P_1$−$P_{Q1}(\theta)$)] from the calculated value ($Cv_{Q1}(\theta)$) of the conductance of the valve at the opening/closing angle ($\theta$) associated with the current position of the switching plate of the valve, the calculated value ($P_{Q1}(\theta)$) of the known specified pressure within the treatment chamber at the conductance ($Cv_{Q1}(\theta)$), and the corresponding correction value (Cc($\theta$)) for the current pressure ($P_1$) actually measured within the treatment chamber and the opening/closing angle ($\theta$) associated with the current position of the switching plate of the valve.

3. A method for controlling pressure in a treatment chamber according to claim 2, characterized in that the correction value (Cc($\theta$)) is calculated from the expression Cc($\theta$)=$Cv_{Q1}(\theta)$−$Cv_{Q2}(\theta)$/$P_{Q1}(\theta)$−$P_{Q2}(\theta)$ as the general relationship of the ratio of the change in the characteristic conductance ($Cv_{Q1}(\theta)$, $Cv_{Q2}(\theta)$) of the valve and the pressure ($P_{Q1}(\theta)$, $P_{Q2}(\theta)$) within the treatment chamber between two gas flow rates ($Q_1$, $Q_2$) arbitrarily selected within the range of the practical zone of transitional flow in a graph of the function indicating the relationship between the physically determined characteristic conductance of the valve and the pressure within the treatment chamber, the correction value (Cc($\theta$)) is calculated and stored in advance for each opening/closing angle ($\theta$) of the switching plate of the valve, the correction value (Cc($\theta$)) that corresponds to the opening/closing angle ($\theta$) is selected in accordance with the opening/closing angle ($\theta$) associated with the current position of the switching plate of the valve, and the selected correction value is inputted into the expression Cv($\theta$, P)=$Cv_{Q1}(\theta)$+[Cc($\theta$)×($P_1$−$P_{Q1}(\theta)$)].

4. A method for controlling pressure in a treatment chamber according to claim 3, characterized in that the characteristic conductances ($Cv_{Q1}(\theta)$, $Cv_{Q2}(\theta)$) of the valve at the two gas flow rates ($Q_1$, $Q_2$) arbitrarily selected within the transitional flow range, which is the practical zone, are calculated in advance for each opening/closing angle ($\theta$) of the switching plate of the valve according to the expressions $Cv_{Q1}(\theta)$=$Q_1$/[$P_{Q1}(\theta)$−($Q_1$/Sp)] and $Cv_{Q2}(\theta)$=$Q_2$/[$P_{Q2}(\theta)$−($Q_2$/Sp)], respectively, from the two gas flow rates ($Q_1$, $Q_2$), the pressures ($P_{Q1}(\theta)$, $P_{Q2}(\theta)$) within the treatment chamber measured at the two gas flow rates ($Q_1$, $Q_2$), and the known characteristic suction rate (Sp) of the suction pump, and the correction value (Cc($\theta$)) is calculated by inputting the calculated conductances ($Cv_{Q1}(\theta)$, $Cv_{Q2}(\theta)$) and the pressures ($P_{Q1}(\theta)$, $P_{Q2}(\theta)$) within the treatment chamber measured at the two gas flow rates ($Q_1$, $Q_2$) into the expression Cc($\theta$)=$Cv_{Q1}(\theta)$−$Cv_{Q2}(\theta)$/$P_{Q1}(\theta)$−$P_{Q2}(\theta)$.

5. A method for controlling pressure in a treatment chamber according to claim 3, characterized in that the gas flow rate values of 100 sccm and 200 sccm are used as the two gas flow rates ($Q_1$, $Q_2$) arbitrarily selected within the transitional flow range, which is the practical zone.

6. A method for controlling pressure in a process chamber according to claim 1, characterized in that the calculated current predicted outflow rate Qo(n) of gas is fed back by being re-inputted in the form of the term Qo(n−1) in the expression P2=P1−(Qo(n−1)/f2($\Theta$,P)) used to derive the current pressure (P2) within the vacuum pump; the P2 thusly calculated is then substituted for the terms P2 and f1(P2) in the expression Qo(n)=P2*f1 (P2) used to derive the predicted current outflow rate of gas discharged from the process chamber, whereby the current predicted outflow rate Qo(n) of gas is calculated; and the inflow rate (Qi) at which it is necessary for gas to flow into the process chamber to reach the target pressure (Psp) is calculated constantly, according to change in the current pressure (P2) within the vacuum pump.

7. A method for controlling pressure in a process chamber according to claim 1, characterized in that the gate is displaced to a position equivalent to a preset opening/closing angle ($\Theta$), to obtain a specific conductance (Cv) necessary for the valve to ensure the inflow rate (Qi), and the pressure within the process chamber is controlled to the target pressure (Psp).

8. A method for controlling pressure in a process chamber according to claim 1, characterized in that a characteristic conductance (Cv=$f_2(\theta)$) of the valve at the opening/closing angle ($\theta$) associated with the current position of the gate of the valve is stored in advance, for each class of the valves; a characteristic pumping rate (Sp=$f_1(P_2)$) of the vacuum pump at preset pressure is stored in advance, for each class of the vacuum pumps; and the current predicted outflow rate Qo(n) at which gas is discharged from the process chamber is calculated.

9. A method for controlling pressure in a process chamber according to claim 8, characterized in that the inputted characteristic pumping rate (Sp=$f_1(P_2)$) of the vacuum pump is switched in accordance with the class of the vacuum pump, and the inputted characteristic conductance (Cv=$f_2(\theta)$) of the valve at the opening/closing angle ($\theta$) associated with the current position of the gate of the valve is switched in accordance with the class of the valve.

10. A device for controlling pressure in a treatment chamber, for regulating the pressure of gas inside a treatment chamber in a semiconductor production step, via a valve situated between the treatment chamber and a suction pump for suctioning gas from within the treatment chamber, the device for controlling pressure in a treatment chamber characterized by comprising: outflow rate computing means for computing a predicted outflow rate (Qo) at which gas is discharged from the treatment chamber via the suction pump by the suction of the suction pump; required inflow rate computing means for calculating, on the basis of the expression Qi=Qo+(P/$\Delta$t)V, a required inflow rate (Qi) at which it is necessary for gas to flow into the treatment chamber in order to reach a preset target pressure (Psp) within the treatment chamber, from a known volume (V) of the treatment chamber and a pressure change rate ($\Delta P/\Delta t$) required for the current pressure ($P_1$) within the treatment chamber to reach the target pressure (Psp), the rate being derived from the difference between the current pressure ($P_1$) and the target pressure (Psp); and inflow rate regulating means for regulating the inflow rate at which gas is to flow into the treatment chamber, to the required inflow rate (Qi) calculated on the basis of the required inflow rate computing means; and when inflow of the required inflow rate (Qi) into the treatment chamber is brought about by the inflow rate regulating means and the pressure within the treatment chamber is controlled to the target pressure (Psp), in calculation by the outflow rate computing means of a current predicted outflow rate (Qo(n)) at which gas is discharged from the treatment chamber on the basis of the expression Qo(n)=$P_2 * f_1(P_2)$, using a current pressure ($P_2$) within the suction pump and a known characteristic suction rate (Sp=$f_1(P_2)$) of the suction pump under prescribed pressure, the current pressure ($P_2$) within the suction pump is calculated according to the expression $P_2 = P_1 - (Qo(n-1)/f_2(\theta, P))$ from an accurate conductance (Cv($\theta$, P)=$f_2(\theta, P)$) calculated by adding the error between the current pressure ($P_1$) actually measured within the treatment chamber and a known specified pressure (P) within the treatment chamber at the characteristic conductance (Cv=$f_2(\theta)$) of the valve at the opening/closing angle ($\theta$) associated with the current position of the switching plate of the valve to the known characteristic conductance (Cv=$f_2(\theta)$) of the valve at the opening/closing angle ($\theta$) associated with the current position of the switching plate of the valve, and the current predicted outflow rate Qo(n) at which gas is discharged from the treatment chamber is calculated.

11. A device for controlling pressure in a treatment chamber according to claim 10, characterized in that, after establishing and storing a correction value (Cc($\theta$)) in advance for each of the opening/closing angles ($\theta$) of the switching plate of the valve, the correction value (Cc($\theta$)) being specified by taking into account the change in conductance of the valve and the change in pressure within the treatment chamber, the outflow rate computing means calculates the accurate conductance (Cv($\theta$, P)=$f_2(\theta, P)$) according to the expression Cv($\theta$, P)=$Cv_{Q1}(\theta)+[Cc(\theta) \times (P_1 - P_{Q1}(\theta))]$ from the calculated value ($Cv_{Q1}(\theta)$) of the conductance of the valve at the opening/closing angle ($\theta$) associated with the current position of the switching plate of the valve, the calculated value ($P_{Q1}(\theta)$) of the known specified pressure within the treatment chamber at the conductance ($Cv_{Q1}(\theta)$), and the corresponding correction value (Cc($\theta$)) for the current pressure ($P_1$) actually measured within the treatment chamber and the opening/closing angle ($\theta$) associated with the current position of the switching plate of the valve.

12. A device for controlling pressure in a treatment chamber according to claim 11, characterized in that the outflow rate computing means calculates the correction value (Cc($\theta$)) from the expression Cc($\theta$)=$Cv_{Q1}(\theta) - Cv_{Q2}(\theta) / P_{Q1}(\theta) - P_{Q2}(\theta)$ as the general relationship of the ratio of the change in the characteristic conductance ($Cv_{Q1}(\theta)$, $Cv_{Q2}(\theta)$) of the valve and the pressure ($P_{Q1}(\theta)$, $P_{Q2}(\theta)$) within the treatment chamber between two gas flow rates ($Q_1$, $Q_2$) arbitrarily selected within the transitional flow range, which is the practical zone, in a graph of the function indicating the relationship between the physically determined characteristic conductance of the valve and the pressure within the treatment chamber, calculates and stores in advance the correction value (Cc($\theta$)) for each opening/closing angle ($\theta$) of the switching plate of the valve, selects the correction value (Cc($\theta$)) that corresponds to the opening/closing angle ($\theta$) in accordance with the opening/closing angle ($\theta$) associated with the current position of the switching plate of the valve, and inputs the selected correction value into the expression Cv($\theta$, P)=$Cv_{Q1}(\theta)+[Cc(\theta) \times (P_1 - P_{Q1}(\theta))]$.

13. A device for controlling pressure in a treatment chamber according to claim 12, characterized in that the outflow rate computing means calculates in advance, for each opening/closing angle ($\theta$) of the switching plate of the valve, the characteristic conductances ($Cv_{Q1}(\theta)$, $Cv_{Q2}(\theta)$) of the valve at the two gas flow rates ($Q_1$, $Q_2$) arbitrarily selected within the transitional flow range, which is the practical zone, according to the expressions $Cv_{Q1}(\theta)=Q_1/[P_{Q1}(\theta)-(Q_1/Sp)]$ and $Cv_{Q2}(\theta)=Q_2/[P_{Q2}(\theta)-(Q_2/Sp)]$, respectively, from the two gas flow rates ($Q_1$, $Q_2$), the pressures ($P_{Q1}(\theta)$, $P_{Q2}(\theta)$) within the treatment chamber measured at the two gas flow rates ($Q_1$, $Q_2$), and the known characteristic suction rate (Sp) of the suction pump, and calculates the correction value (Cc($\theta$)) by inputting the calculated conductances ($Cv_{Q1}(\theta)$, $Cv_{Q2}(\theta)$) and the pressures ($P_{Q1}(\theta)$, $P_{Q2}(\theta)$) within the treatment chamber measured at the two gas flow rates ($Q_1$, $Q_2$) into the expression Cc($\theta$)=$Cv_{Q1}(\theta) - Cv_{Q2}(\theta)/P_{Q1}(\theta) - P_{Q2}(\theta)$.

14. A device for controlling pressure in a treatment chamber according to claim 12, characterized in that the outflow rate computing means uses the gas flow rate values of 100 sccm and 200 sccm as the two gas flow rates ($Q_1$, $Q_2$) arbitrarily selected within the transitional flow range, which is the practical zone.

15. A device for controlling pressure in a process chamber according to claim 10, characterized in that the outflow rate computing means feeds back the calculated current predicted outflow rate Qo(n) of gas through re-inputting thereof in the form of the term Qo(n−1) in the expression P2=P1 (Qo(n−1)/f2(Θ,P)); and then substitutes the thusly calculated P2 for the terms P2 and f1(P2) in the expression Qo(n)=P2*f1 (P2), in order to calculate the current predicted outflow rate Qo(n) of gas; and the inflow rate computing means constantly calculates the inflow rate (Qi) at which it is necessary for gas to flow into the process chamber to reach the target pressure (Psp), according to change in the current pressure (P2) within the vacuum pump, doing so on the basis of the current predicted outflow rate Qo(n) calculated by the outflow rate computing means.

16. A device for controlling pressure in a process chamber according to claim 10, characterized in that the inflow rate regulating means displaces the gate to a position equivalent to a preset opening/closing angle (Θ), to obtain a specific conductance (Cv) necessary for the valve to ensure the inflow rate (Qi), and controls the pressure within the process chamber to the target pressure (Psp).

17. A device for controlling pressure in a process chamber according to claim 10, characterized in that the outflow rate computing means stores in advance, for each class of the valves, a characteristic conductance (Cv=$f_2$(θ)) of the valve at the opening/closing angle (θ) associated with the current position of the valve gate; stores in advance, for each class of the vacuum pumps, a characteristic pumping rate (Sp=$f_1$($P_2$)) of the vacuum pump at preset pressure; and calculates the current predicted outflow rate Qo(n) at which gas is discharged from the process chamber.

18. A device for controlling pressure in a process chamber according to claim 17, characterized by having setting means that can switch the inputted vacuum pump characteristic pumping rate (Sp=$f_1$($P_2$)), in accordance with the class of the vacuum pump, and switch the inputted characteristic conductance (Cv=$f_2$(θ)) of the valve at the opening/closing angle (θ) associated with the current position of the gate of the valve, in accordance with the class of the vacuum pump.

* * * * *

UNITED STATES PATENT AND TRADEMARK OFFICE
CERTIFICATE OF CORRECTION

PATENT NO. : 10,606,288 B2
APPLICATION NO. : 16/141523
DATED : March 31, 2020
INVENTOR(S) : Emmanuel Vyers Page 1 of 1

It is certified that error appears in the above-identified patent and that said Letters Patent is hereby corrected as shown below:

In the Specification

In Column 11, Line 65, please delete "Here, "$\Delta P/\Delta t$" is the rate", and insert therefor --Here, "$\Delta P/\Delta t$" is the rate--.

In Column 12, Line 5, please delete "current pressure (P) to reach the", and insert therefor --current pressure ($P_1$) to reach the--.

In Column 15, Line 55, please delete "($Cv_{Q2}(\ominus)$, $Cv_{Q2}(\ominus)$) of the valve 4", and insert therefor --"($Cv_{Q1}(\ominus)$, $Cv_{Q2}(\ominus)$) of the valve 4--.

In Column 16, Line 10, please delete "$Cv_{Q1}i(\ )$, $Cv_{Q2}(\ominus)$) of the valve 4", and insert therefor --conductance ($Cv_{Q1}(\ominus)$, $Cv_{Q2}(\ominus)$) of the valve 4--.

In Column 17, Line 29, please delete "$Cv_{Q1}(\ominus)=Q/[P_{Q1}(\ominus)-(_{Q1}/Sp)]$", and insert therefor --$Cv_{Q1}(\ominus)=Q_1/[P_{Q1}(\ominus)-Q_1/Sp)]$--.

Signed and Sealed this
Second Day of June, 2020

Andrei Iancu
*Director of the United States Patent and Trademark Office*